US008872095B2

(12) United States Patent
Nathan et al.

(10) Patent No.: US 8,872,095 B2
(45) Date of Patent: *Oct. 28, 2014

(54) SENSOR PIXELS, ARRAYS AND ARRAY SYSTEMS AND METHODS THEREFOR

(71) Applicants: Arokia Nathan, Cambridge (GB); G. Reza Chaji, Waterloo (CA)

(72) Inventors: Arokia Nathan, Cambridge (GB); G. Reza Chaji, Waterloo (CA)

( * ) Notice: Subject to any disclaimer, the term of this patent is extended or adjusted under 35 U.S.C. 154(b) by 0 days.

This patent is subject to a terminal disclaimer.

(21) Appl. No.: 14/096,572

(22) Filed: Dec. 4, 2013

(65) Prior Publication Data

US 2014/0091207 A1 Apr. 3, 2014

Related U.S. Application Data

(63) Continuation of application No. 13/942,285, filed on Jul. 15, 2013, now abandoned, which is a continuation of application No. 12/530,151, filed as application No. PCT/CA2007/002238 on Dec. 17, 2007, now Pat. No. 8,487,231.

(30) Foreign Application Priority Data

Mar. 5, 2007 (CA) ..................................... 2582243
Jul. 13, 2007 (CA) ..................................... 2594737

(51) Int. Cl.
G01J 1/44 (2006.01)
G01D 5/14 (2006.01)
H01L 27/146 (2006.01)
H01L 27/148 (2006.01)
H01L 31/04 (2014.01)
G01R 27/26 (2006.01)
G01J 1/46 (2006.01)
H04N 5/357 (2011.01)
G01D 5/24 (2006.01)
H04N 5/378 (2011.01)

(52) U.S. Cl.
CPC ............. H01L 27/14612 (2013.01); G01J 1/46 (2013.01); H04N 5/357 (2013.01); G01D 5/24 (2013.01); H04N 5/378 (2013.01); H01L 27/14609 (2013.01)
USPC ................... 250/214 A; 250/208.1; 348/308; 324/686

(58) Field of Classification Search
USPC ........ 250/208.1, 208.2, 214 A; 348/301, 308; 324/658, 661, 686
See application file for complete search history.

(56) References Cited

U.S. PATENT DOCUMENTS 4,831,257 A * 5/1989 McClelland et al. ...... 250/338.1
5,424,650 A * 6/1995 Frick ............................ 324/688

(Continued)

OTHER PUBLICATIONS

U.S. Appl. No. 12/530,151, Response filed Dec. 19, 2012 to Non Final Office Action mailed Oct. 5, 2012, 9 pgs.

(Continued)

Primary Examiner — John Lee
(74) Attorney, Agent, or Firm — Schwegman Lundberg & Woessner, P.A.

(57) ABSTRACT

One sensor pixel includes amplifying transistor, coupled between first bias line and data line; switch transistor, operated by control line and coupled between data line and gate of amplifying transistor; storage capacitor, coupled to second bias line; and sensor being coupled to gate of amplifying transistor. Another sensor pixel includes first amplifying transistor coupled between first bias line and data line; second amplifying transistor being coupled between second bias line and data line; switch transistor being operated by control line and being coupled between data line and gates of first and second amplifying transistors; storage capacitor coupled to gates of first and second amplifying transistors; and sensor coupled to gates of first and second amplifying transistors. Trap-assisted absorption, variable capacitor described for sensor pixels, and also biasing to reduce flicker and aging, and to compensate for aging, described for sensor pixels.

5 Claims, 28 Drawing Sheets

(56) References Cited

U.S. PATENT DOCUMENTS

| | | | |
|---|---|---|---|
| 5,604,364 A | | 2/1997 | Ohmi et al. |
| 5,962,844 A | | 10/1999 | Merrill et al. |
| 6,058,783 A | * | 5/2000 | Berthold et al. ............... 73/766 |
| 6,252,218 B1 | | 6/2001 | Chou |
| 6,448,790 B1 | * | 9/2002 | Imai ............................. 324/661 |
| 6,933,873 B1 | * | 8/2005 | Horsley et al. ............... 341/148 |
| 6,974,944 B2 | | 12/2005 | Funakoshi et al. |
| 7,005,626 B2 | | 2/2006 | Chan et al. |
| 7,126,349 B2 | * | 10/2006 | Hara ............................. 324/658 |
| 7,183,555 B2 | | 2/2007 | Jarron |
| 7,397,448 B2 | | 7/2008 | Stevenson et al. |
| 7,683,638 B2 | * | 3/2010 | Chuang et al. ............... 324/686 |
| 7,683,639 B2 | * | 3/2010 | Chuang et al. ............... 324/686 |
| 7,683,640 B2 | * | 3/2010 | Chuang et al. ............... 324/686 |
| 8,487,231 B2 | * | 7/2013 | Nathan et al. ............... 250/208.1 |
| 2002/0117682 A1 | | 8/2002 | Vande Voorde et al. |
| 2003/0222659 A1 | * | 12/2003 | Miyasaka ..................... 324/661 |
| 2004/0257155 A1 | | 12/2004 | McEwen |
| 2005/0062485 A1 | * | 3/2005 | Hara ............................. 324/661 |
| 2005/0088185 A1 | * | 4/2005 | Sano et al. ..................... 324/661 |
| 2005/0231656 A1 | | 10/2005 | den Boer et al. |
| 2006/0012587 A1 | | 1/2006 | Stevenson et al. |
| 2006/0043297 A1 | | 3/2006 | Ouvrier-Buffet et al. |
| 2008/0111714 A1 | * | 5/2008 | Kremin ........................... 341/33 |
| 2009/0146669 A1 | * | 6/2009 | Chuang et al. ............... 324/686 |
| 2009/0206848 A1 | * | 8/2009 | Chuang et al. ............... 324/686 |
| 2009/0206849 A1 | * | 8/2009 | Chuang et al. ............... 324/686 |
| 2009/0206850 A1 | * | 8/2009 | Chuang et al. ............... 324/686 |
| 2010/0140455 A1 | | 6/2010 | Nathan et al. |
| 2010/0182596 A1 | | 7/2010 | Shannon et al. |
| 2012/0129732 A1 | | 5/2012 | Rothberg et al. |
| 2013/0299680 A1 | | 11/2013 | Nathan, Arokia et al. |

OTHER PUBLICATIONS

U.S. Appl. No. 12/530,151, Non Final Office Action mailed Oct. 5, 2012, 7 pgs.

U.S. Appl. No. 12/530,151, Notice of Allowance mailed Mar. 18, 2013, 7 pgs.

U.S. Appl. No. 13/942,285, Response filed Sep. 5, 2013 to Non Final Office Action mailed Sep, 3, 2013, 6 pgs.

U.S. Appl. No. 13/942,285, Non Final Office Action mailed Sep. 3, 2013, 6 pgs.

International Application Serial No. PCT/CA2007/002238, International Search Report mailed, 3 pgs., mailed on Apr. 25, 2008.

* cited by examiner

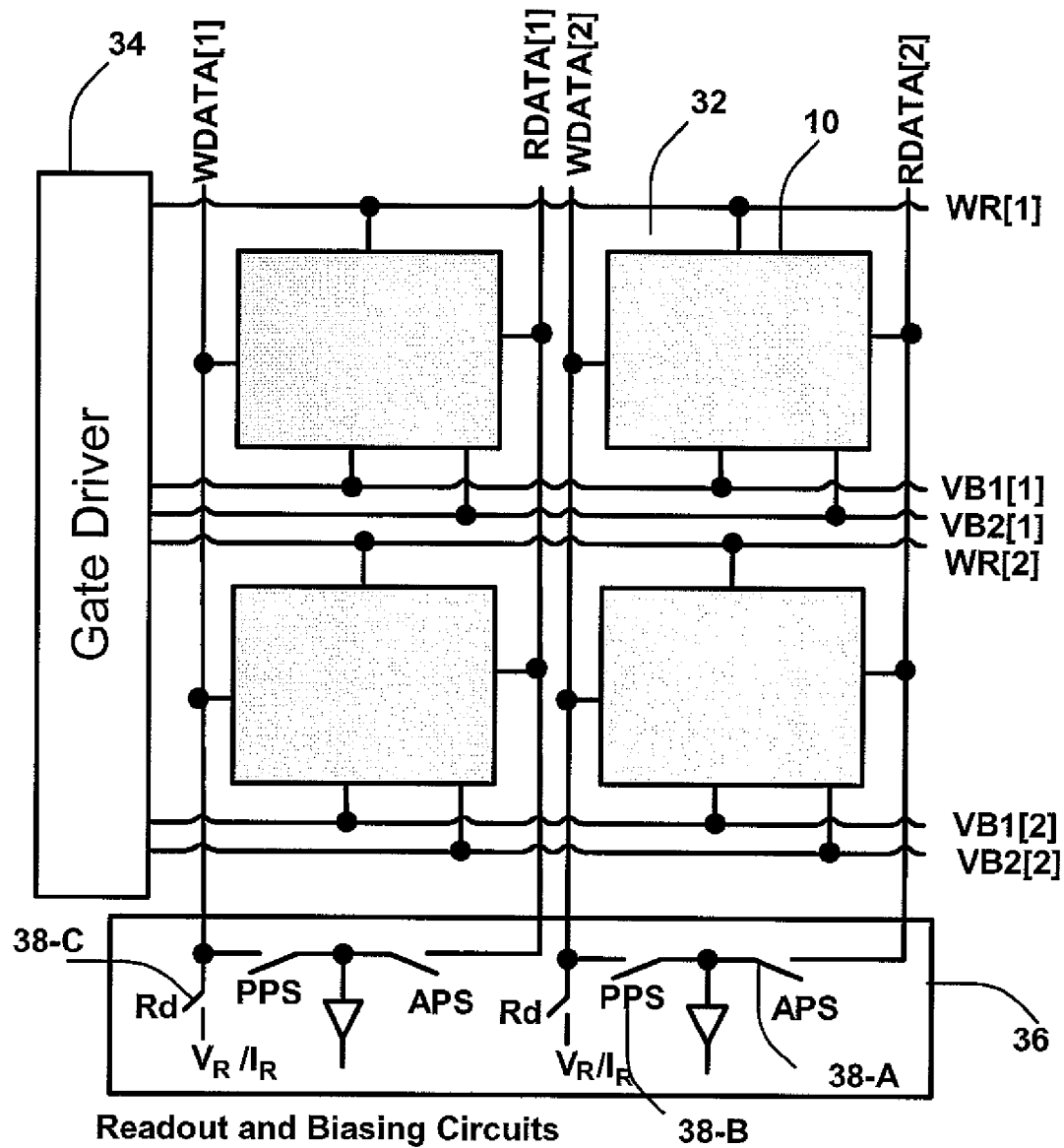
FIG. 3-A

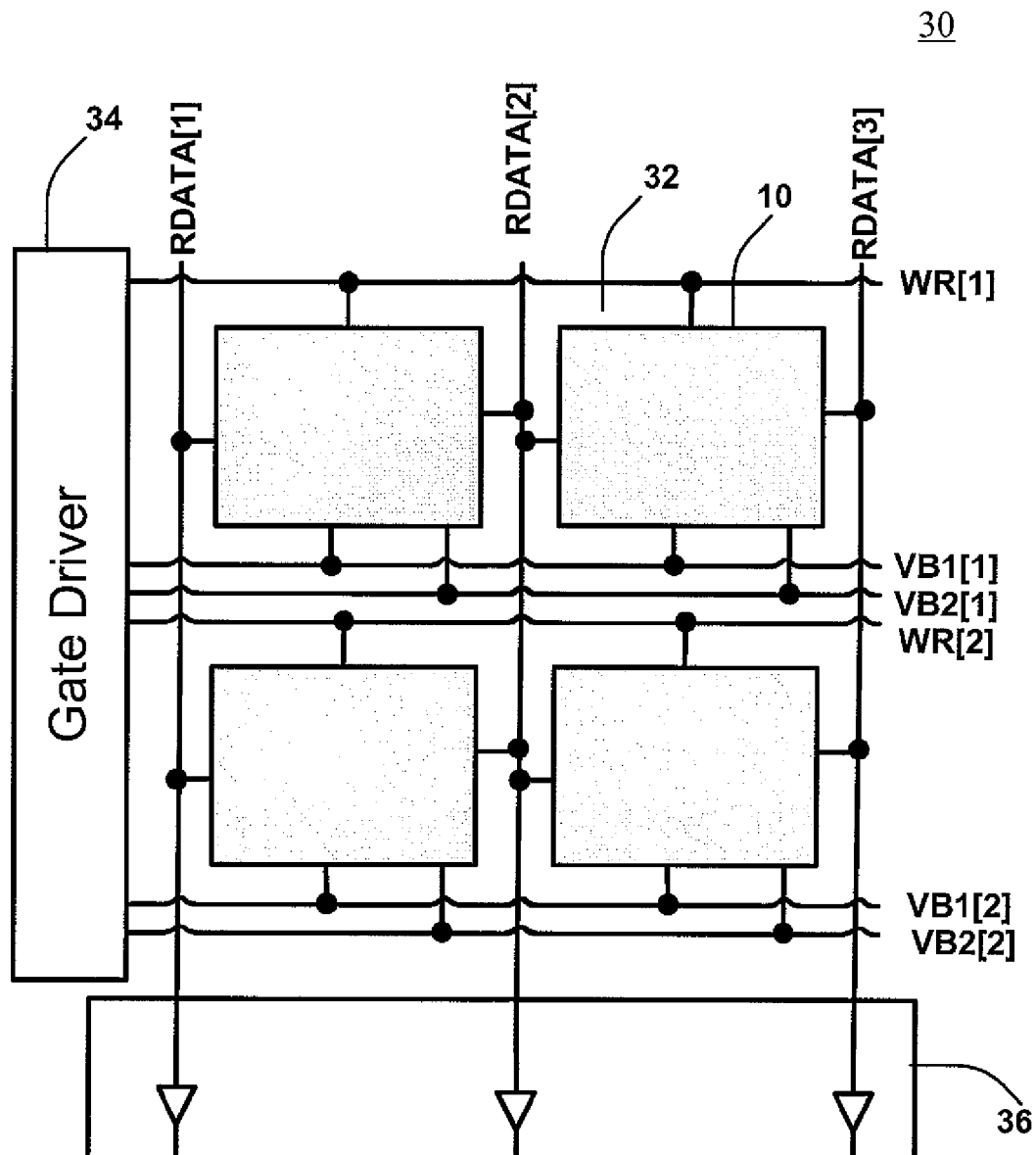
FIG. 3-B

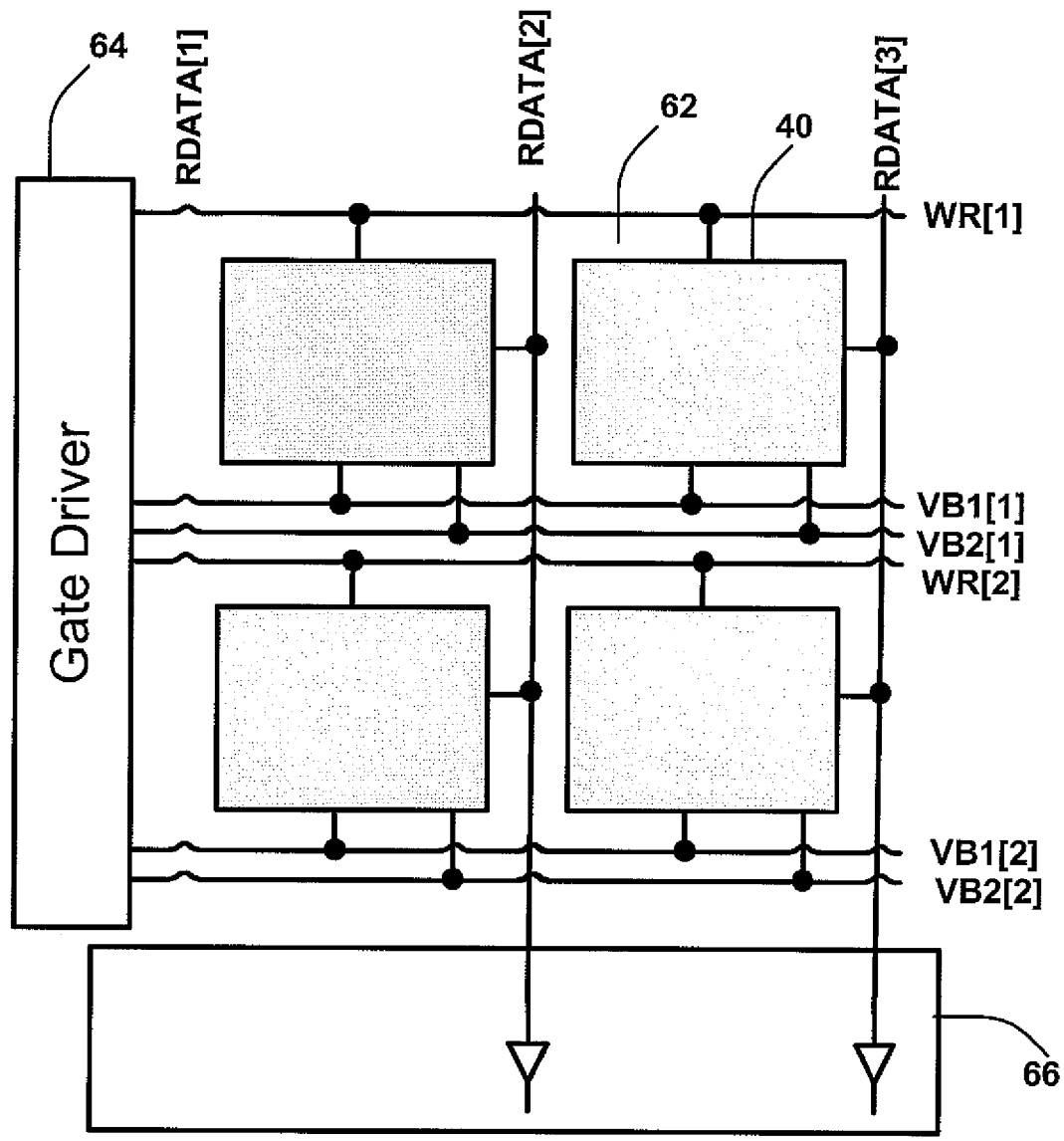
FIG. 6-A

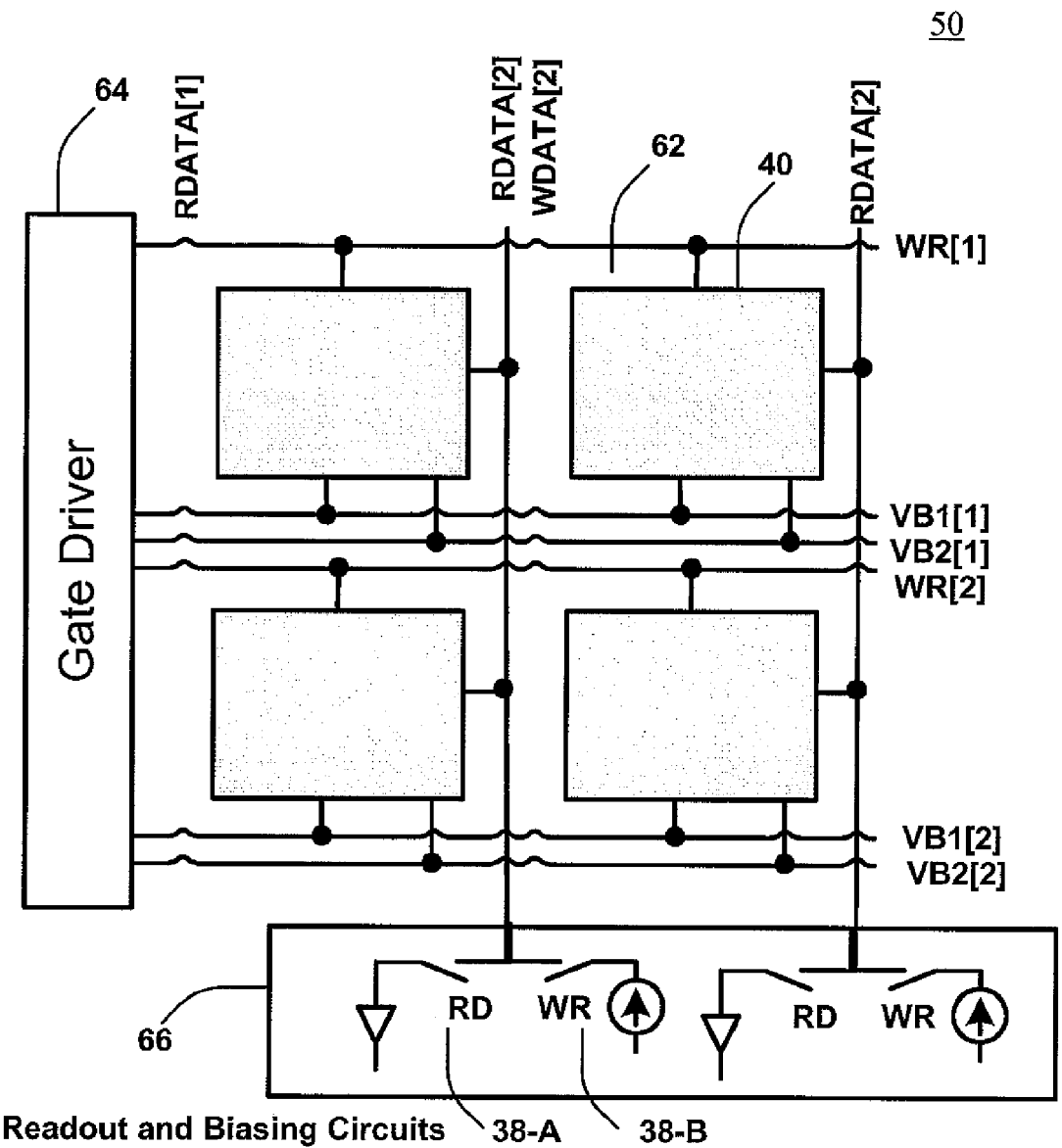
FIG. 6-B

SENSOR PIXELS, ARRAYS AND ARRAY SYSTEMS AND METHODS THEREFOR

CROSS-REFERENCE TO RELATED APPLICATIONS

This application is a continuation application of U.S. patent application Ser. No. 13/942,285 filed 15 Jul. 2013, which is a continuation application of U.S. patent application Ser. No. 12/530,151 filed 4 Sep. 2009, which is a national stage application under 35 U.S.C. §371 of International Application No. PCT/CA2007/002238 filed 17 Dec. 2007 and claims the benefit of the filing dates of Canadian Patent Application No. 2,582,243 filed 5 Mar. 2007 under the title LOW NOISE HYBRID ACTIVE-PASSIVE PIXEL FOR DIFFERENT SENSOR APPLICATIONS and Canadian Patent Application No. 2,594,737 filed 13 Jul. 2007 under the title HIGH SENSITIVITY a-Si:H PHOTO TRANSISTOR WITH FLICKER NOISE REDUCTION FOR NEAR INFRA_RED IN-VIVO BIO-MOLECULAR IMAGING. The content of the above patent applications and Canadian Patent Application No. 2,564,239 filed 10 Oct. 2006 under title LOW NOISE ACTIVE PIXEL SENSOR is hereby expressly incorporated by reference into the detailed description hereof.

FIELD OF INVENTION

The present invention relates to imaging systems, sensor pixels, and more specifically to methods and systems for sensor pixels and applications thereof.

BACKGROUND OF THE INVENTION

Sensor pixel circuits (sensor pixels) have many applications. For example, when used in pixel arrays as part of a pixel array system for reading out sensed data, such pixel array systems can be used as charge coupled devices (CCDs) for use in digital cameras. Sensor pixels, pixel arrays and pixel array systems also find use in biomolecular and biomedical imaging, chemical sensing and a wide range of other fields.

It is desirable to provide alternative circuits, arrays and systems. It is also desirable to provide alternative methods of operating existing circuits, arrays and systems, and it is desirable to provide methods of operating alternative circuits, arrays and systems.

SUMMARY OF THE INVENTION

In accordance with a first aspect of the present invention there is provided a sensor pixel. The sensor pixel includes an amplifying transistor having a first terminal, a second terminal and a gate terminal, the first terminal of the amplifying transistor is coupled to a first bias line. The pixel also includes a switch transistor having a first terminal, a second terminal and a gate terminal, the gate terminal of the switch transistor are operated by a control line. The pixel further includes a storage capacitor having a first terminal and a second terminal, the first terminal of the storage capacitor being coupled to a second bias line. The pixel additionally includes a sensor. The second terminal of the amplifying transistor and the first terminal of the switch transistor are coupled to at least one data line. The sensor, the second terminal of the storage capacitor, the second terminal of the switch transistor are coupled to the gate terminal of the amplifying transistor.

The at least one data line may include a first data line coupled to the second terminal of the amplifying transistor, and a second data line coupled to the first terminal of the switch transistor.

Each of the first and second bias lines and the data line may be used at a predetermined timing to bias the pixel.

In accordance with a second aspect of the present invention there is provided a method for operating a sensor pixel. The sensor pixel includes an amplifying transistor having a first terminal, a second terminal and a gate terminal; a switch transistor having a first terminal, a second terminal and a gate terminal; a storage capacitor having a first terminal and a second terminal; and a sensor. The first terminal of the amplifying transistor is coupled to a first bias line. The gate terminal of the switch transistor is operated by a control line. The first terminal of the storage capacitor is coupled to a second bias line. The second terminal of the amplifying transistor and the first terminal of the switch transistor are coupled to at least one data line. The sensor, the second terminal of the storage capacitor, and the second terminal of the switch transistor are coupled to the gate terminal of the amplifying transistor at a coupling node. The method includes the steps of at a first operating cycle, charging the coupling node; at a second operating cycle, changing the voltage of the coupling node by a sensor signal generated by the sensor; and at a third operating cycle, applying a current or voltage to the at least one data line and operating on the first bias line and the second bias line.

In accordance with a third aspect of the present invention there is provided a sensor pixel. The sensor pixel includes a first amplifying transistor having a first terminal, a second terminal and a gate terminal, the first terminal of the first amplifying transistor is coupled to a first bias line. The sensor pixel also includes a second amplifying transistor having a first terminal, a second terminal and a gate terminal, the first terminal of the second amplifying transistor is coupled to a second bias line. The sensor pixel further includes a switch transistor having a first terminal, a second terminal and a gate terminal, the gate terminal of the switch transistor is operated by a control line. The sensor pixel additionally includes a storage capacitor having a first terminal and a second terminal. The sensor pixel further includes a sensor. The second terminal of the first amplifying transistor, the second terminal of the second amplifying transistor and the first terminal of the switch transistor are coupled to at least one data line. The sensor, the second terminal of the storage capacitor, and the second terminal of the switch transistor are coupled to the gate terminal of the first amplifying transistor and the gate terminal of the second amplifying transistor.

The at least one data line may include a first data line coupled to the second terminal of the first and second amplifying transistors, and a second data line coupled to the first terminal of the switch transistor. The first bias line and the second bias line may be alternately switched.

In accordance with a fourth aspect of the present invention there is provided a method for operating a sensor pixel. The sensor pixel includes a first amplifying transistor having a first terminal, a second terminal and a gate terminal; a second amplifying transistor having a first terminal, a second terminal and a gate terminal; a switch transistor having a first terminal, a second terminal and a gate terminal; a storage capacitor having a first terminal and a second terminal; and a sensor. The first terminal of the first amplifying transistor is coupled to a first bias line. The first terminal of the second amplifying transistor is coupled to a second bias line. The gate terminal of the switch transistor is operated by a control line. The second terminal of the first amplifying transistor, the second terminal of the second amplifying transistor and the first terminal of the switch transistor are coupled to at least one data line. The sensor, the second terminal of the storage capacitor, the second terminal of the switch transistor are coupled to the gate terminal of the first and second amplifying transistors. The method includes the steps of, at a selecting cycle, selecting the pixel and, at a read out cycle, alternately switching the first bias line and the second bias line.

In accordance with a fifth aspect of the present invention there is provided a method for a sensor pixel having a first photo transistor and a second photo transistor, each having a first terminal, a second terminal and a gate terminal, the method comprising the steps of, at a first operating cycle, resetting the first and second photo transistors and, at a second operating cycle, reading sensed data from the first photo transistor and the second photo transistor, including alternately biasing the first terminals of the first photo transistor and the second photo transistor.

The step of reading may include sensing the second terminals of the first photo transistor and the second photo transistor. The step of resetting at the first operating cycle may include setting the gate terminals of the first photo transistor and the second photo transistor to a predetermined level.

The method may further include, at a third operating cycle, resetting the first photo transistor and the second photo transistor. The step of resetting the first and second photo transistors may include turning off the first and second transistors.

In accordance with a sixth aspect of the present invention there is provided a method for a sensor pixel in a sensor pixel array, the method including the steps of any of the methods for a sensor pixel of the other aspects, and, following reading sensed data of the first photo transistor and the second photo transistor of the pixel, resetting the first photo transistor and the second photo transistor of the pixel before reading another pixel in the array.

The pixel may be part of a pixel array in any method for a sensor pixel of the other aspects. The pixel array may be part of a pixel array system, and the method may also include addressing individual pixels in the pixel array to perform the method on each pixel. The pixels may be addressed sequentially.

In accordance with a further aspect of the present invention there is provided a sensor pixel. The sensor pixel includes a first photo transistor and a second photo transistor, each having a first terminal, a second terminal and a gate terminal. The gate terminals of the first photo transistor and the second photo transistor are coupled to a control line. The first terminals of the first photo transistor and the second photo transistor are coupled to a first data line. The second terminal of the first photo transistor is coupled to a first bias line. The second terminal of the second photo transistor is coupled to a second bias line. The first bias line and the second bias line are alternately switched during readout cycle.

At least one of the first and second photo transistors may be an inverted staggered a-Si:H photo-TFT. At least one of the first and second photo transistors may include a glass substrate with the gate deposited on the glass substrate; a-Si:Nx layer and a-Si:H layer deposited on the gate; a drain electrode and a source electrode deposited on the a-Si:H layer; and a passivation layer deposited on the source and drain electrodes.

In accordance with another aspect of the present invention there is provided a method for a sensor pixel having a sensor, a switch transistor, a first transistor, a second transistor, and a storage capacitor. The transistor has a first terminal, a second terminal and a gate terminal. The method includes the steps of, at a first cycle, charging the storage capacitor; at a second cycle, integrating a sensor signal from the sensor by the storage capacitor; and, at a third cycle, reading sensed data from the first transistor and the second transistor, including alternately biasing the first terminals of the first transistor and the second transistor.

The step of reading may include sensing the second terminals of the first transistor and the second transistor. The step of reading comprises may include sensing the first terminal of the switch transistor and the second terminals of the first transistor and the second transistor; while, the sensor, the storage capacitor and the gate terminals of the first transistor and the second transistor are connected to the second terminal of the switch transistor.

In accordance with an additional aspect of the present invention there is provided a sensor pixel array. The sensor pixel array includes a plurality of sensor pixels in accordance with any sensor pixel of the other aspects, wherein the plurality of sensor pixels are organized in an array.

In accordance with a further additional aspect of the present invention there is provided a sensor pixel array system. The system includes a plurality of sensor pixels in accordance with any sensor pixel of the other aspects, wherein the plurality of sensor pixels are organized in an array; an address driver to individually address the sensor pixels; and a read out circuit coupled to the sensor pixels to read out data sensed by the sensor pixels.

In accordance with a still further aspect of the present invention there is provided a method for a sensor pixel that includes circuitry to sense an environmental condition and to amplify and readout a signal representative of the sensed condition. Such circuitry includes two transistors to amplify separately the signal during readout. The method includes, during readout, alternately turning on a respective one of the amplification transistors of the sensor pixel circuitry and turning off the other amplification transistor to reduce flicker.

The method may further include turning the two transistors of the sensor pixel circuitry off except when reading out the signal from the circuitry to reduce aging of the transistor.

In accordance with a still additional aspect of the present invention there is provided a sensor pixel including a sensor, at least one transistor to amplify output from the sensor, and a storage capacitor to store charge based on amplified output from the transistor, wherein the storage capacitor is a variable capacitor.

The variable capacitor may be a metal-insulator-semiconductor having a bias line such that the bias condition of the capacitor may be changed to adjust the capacitance of the capacitor.

In accordance with a still further additional aspect of the present invention there is provided a sensor pixel including a sensor, at least one transistor to amplify output from the sensor, and a storage capacitor to store charge based on amplified output from the transistor, wherein the sensor is a variable capacitor.

In accordance with another still further additional aspect of the present invention there is provided a sensor pixel including any of the sensor pixels in accordance with any sensor pixel of the other aspects herein that includes a capacitor, and the capacitor is a variable capacitor.

The variable capacitor may be a metal-insulator-semiconductor having a bias line such that the bias condition of the capacitor may be changed to adjust the capacitance of the capacitor.

The variable capacitor may be a storage capacitor of the sensor pixel. The variable capacitor may be a sensor of the sensor pixel. The variable capacitor may be both a storage capacitor and sensor of the sensor pixel.

In accordance with yet another aspect of the present invention there is provided a method for a sensor pixel including circuitry to sense an environmental condition and to amplify and readout a signal representative of the sensed condition. Such circuitry includes at least one transistor to amplify the signal during readout. The method includes turning the at least one amplification transistor of the sensor pixel circuitry off except when reading out the signal from the circuitry to reduce aging of the transistor.

Other aspects of the present invention and detailed additional features of the above aspects will be evident based upon the detailed description, FIGURES and claims herein.

BRIEF DESCRIPTION OF THE DRAWINGS

For a better understanding of the present invention and to show more clearly how it may be carried into effect, reference will now be made, by way of example, to the accompanying drawings that show the preferred embodiment of the present invention and in which:

FIG. 3-A is a diagram illustrating an example of an array system including the sensor pixel of FIG. 1;

FIG. 3-B is a diagram illustrating another example of an array system including the sensor pixel of FIG. 1;

FIG. 6-A is a diagram illustrating an example of an array system including the sensor pixel of FIG. 4;

FIG. 6-B is a diagram illustrating an example of an array system including the sensor pixel of FIG. 4;

DETAILED DESCRIPTION

Figure 1:
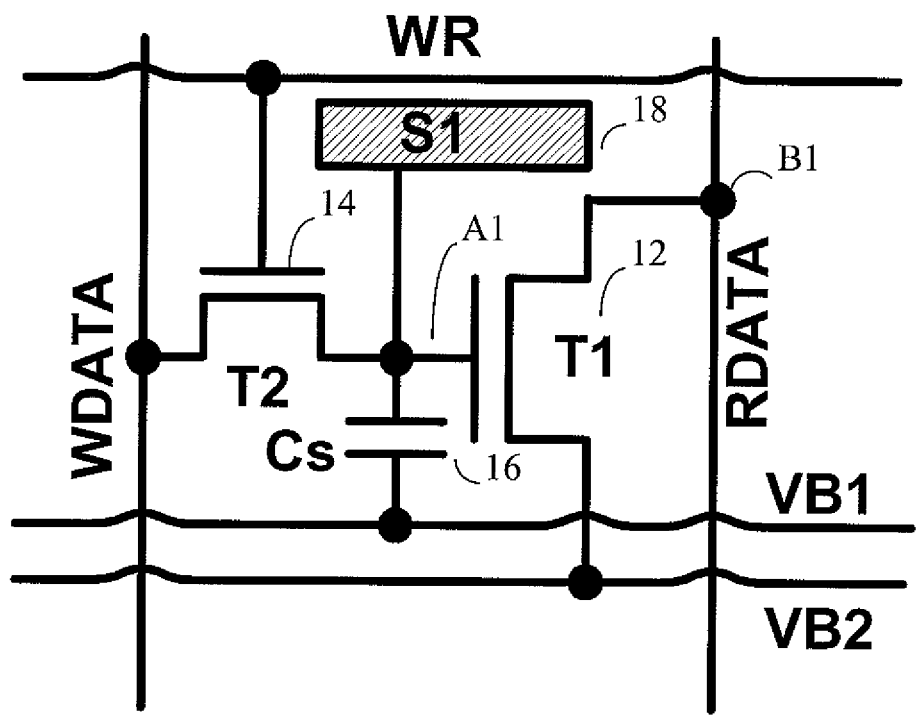
FIG. 1 is a diagram illustrating a sensor pixel circuit in accordance with an embodiment of the present invention.

Embodiments of the present invention are described using a pixel circuit having at least one transistor. The transistor in the pixel circuit may be fabricated in any technologies, including CMOS (e.g., MOSFET), NMOS, PMOS, amorphous silicon, nano/micro crystalline silicon, poly crystalline, oxide semiconductors, and liquid-printed and vacuum deposited organic technology. A pixel array having the pixel circuit may be an active matrix image sensor array, and may be, for examples, but not limited to, used for medical applications from imaging at tissue and organ levels to molecular and cellular levels. The examples include applications for large area multi-modal biomedical and other x-ray imaging (when coupled to a scintillation layer) to optical bio-molecular imaging, including that of fluorescence-based bio-arrays. The examples include sensitive applications including single event detector (single photon, single DNA).

In the description below, "pixel" and "pixel circuit" are used interchangeably. In the description below, "signal" and "line" may be used interchangeably as appropriate in the context. In the description below, the terms "line" and "node" may be used interchangeably as appropriate in the context. In the description below, the terms "select line" and "address line" may be used interchangeably. In the description below, "connect (or connected)" and "couple (or coupled)" may be used interchangeably, and may be used to indicate that two or more elements are directly or indirectly in physical or electrical contact with each other.

Included in this description are a variety of novel pixel circuits that may be used to exploit the flicker reduction, aging reduction, aging compensation, and trap-assisted absorption features and other features described herein; however, it is to be recognized that these circuits do not have to utilise these features and can be operated beneficially in alternative manners. Methods of biasing pixel circuits will be described herein to provide features such as flicker reduction, aging reduction and aging compensation. It is to be recognized that such methods may be applied to the novel pixel circuits described herein; while, the methods may also be applied to alternate pixel circuits including existing pixel circuits. Similarly, trap-assisted absorption may be utilised in alternative pixel circuits including existing pixel circuits.

Pixel circuits described herein will be described with reference to photoelectric sensor pixel circuits; however, it is to be recognized that other sensors and transistors for such sensors, such as chemical sensors, temperature sensors, biomedical transducers, optical sensors, and direct x-ray sensors producing electric charge to be readout of the pixel circuits described herein and other pixel circuits to which the features herein can be applied. Such other sensors may for example be mechanical or chemical sensors, as appropriate. As is known in the art, such sensors may themselves be capacitors.

FIG. 1 illustrates a sensor pixel circuit in accordance with an embodiment of the present invention. The sensor pixel circuit 10 of FIG. 1 includes an amplifying transistor 12, a switch transistor 14, a storage capacitor 16, and a sensor 18. The transistors 12 and 14 are, for example, but not limited to, TFTs (hereinafter referred to as TFT 12, TFT 14, respectively), and each has first and second terminals and a gate terminal. In this embodiment, the pixel circuit 10 is a 2-TFT sensor pixel circuit and may form an active matrix array. The sensor 18 may be, for example, but not limited to, a photo detector, biomedical transducer, chemical sensor, temperature sensor, or direct x-ray sensor. It is well understood by one of ordinary skill in the art that the NMOS transistor in the pixel 10 can be replaced with a PMOS transistor using the concept of complementary circuit design.

The first terminal of TFT 12 is connected to a data line RDATA, and the second terminal of TFT 12 is connected to a bias line VB2. The first terminal of TFT 14 is connected to a data line WDATA, and the second terminal of TFT 14 is connected to the gate terminal of TFT 12 at node A1. The gate terminal of TFT 14 is connected to a write line WR. The storage capacitor 16 is connected to the node A1 and a bias line VB1. The sensor 18 is connected to the node A1.

Figure 5:
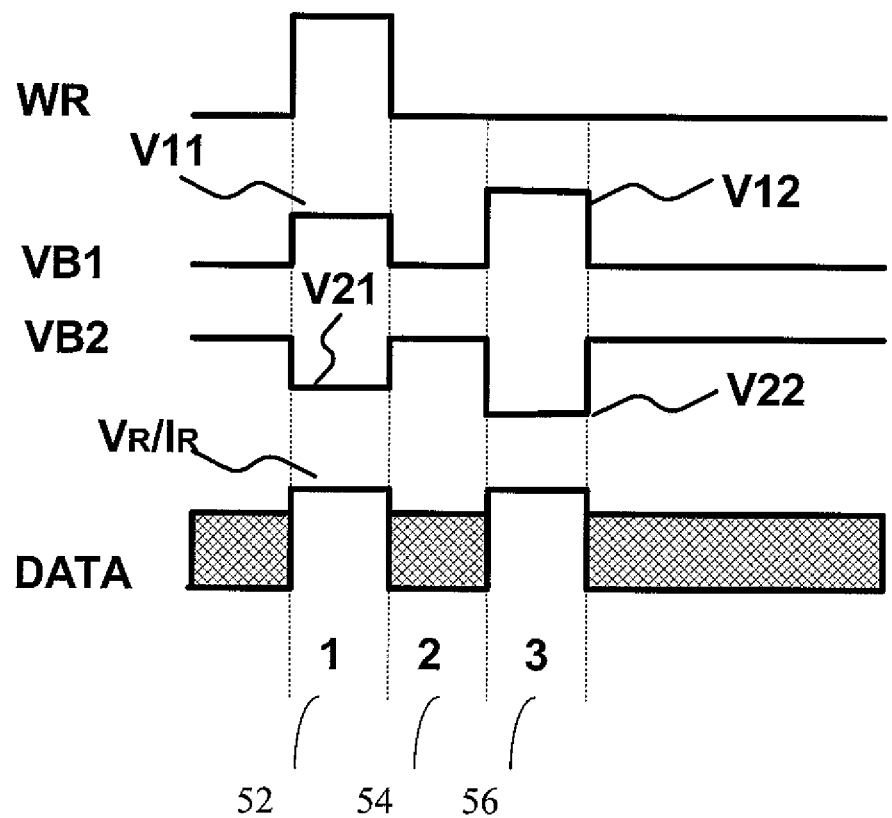
FIG. 5 is a timing chart illustrating an example of waveforms applied to the photo pixel circuit of FIG. 4.

The sensor pixel circuit 10 is biased using a biasing voltage. Also, it can be biased with a biasing current resulting in that mismatching and aging effects of the sensor pixel circuit is reduced. FIG. 5 describes the current biasing. The current is applied to the pixel during the first driving cycle.

Figure 2:
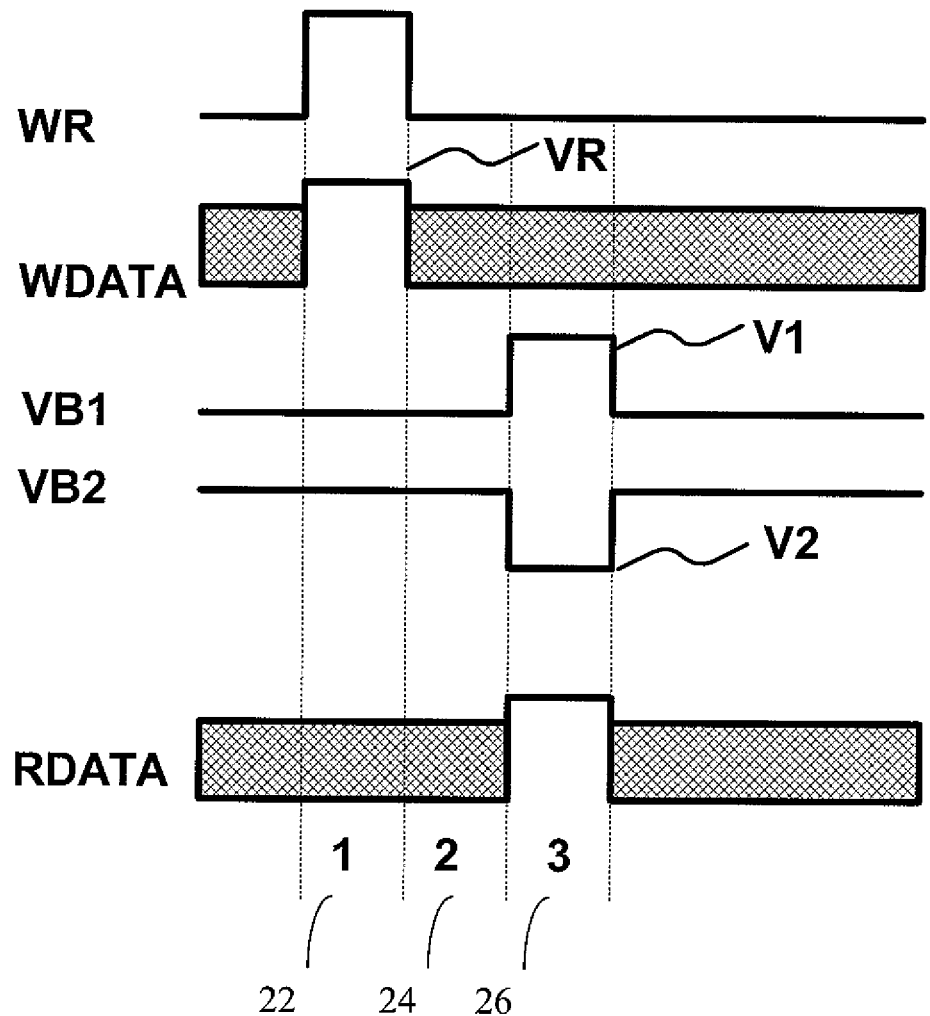
FIG. 2 is a timing chart illustrating an example of waveforms applied to the photo pixel circuit of FIG. 1.

One example of operating cycles for the sensor pixel circuit 10 is illustrated in FIG. 2. Referring to FIGS. 1-2, the operation of the sensor pixel circuit 10 includes three operating cycles 22, 24, and 26. This driving scheme provides low noise, high sensitive, and low power (consumption) sensor.

During the first operating cycle 22, the node A1 is charged to a biasing voltage (VR) by setting WDATA to VP and setting WR to high. During the second operating cycle 24, a sensor signal generated by the sensor 18 changes the voltage at node A1. During the third operating cycle 26, a current/voltage is applied to RDATA while the bias lines VB1 and VB2 go to V1 and V2 respectively to turn on TFT 12. V1 and V2 are defined based on the pixel bias conditions and parasitic capacitances. Therefore, the modulated voltage at node A1 changes the voltage/current at node B1 correspondingly.

The operation of FIG. 2 includes the second operating cycle 24 and the third operating cycle 26. However, in another example, the second and third operating cycles 24 and 26 may be repeated with and without sensor effects, correlated double sampling (CDS), to manage the leakage current, reset noise, and low frequency noise effects.

FIG. 3-A illustrates an example of an array structure including the sensor pixel circuit 10 of FIG. 1. The sensor pixel array system 30 of FIG. 3-A has programming and readout functions for a sensor pixel array 32. The sensor pixel array 32 includes a plurality of sensor pixel circuits corresponding to that of FIG. 1. The sensor pixel array system 30 further includes an address driver 34 and a read out circuit 36.

In FIG. 3-A, VB1[i] corresponds to VB1 of FIG. 1, VB2[i] corresponds to VB2 of FIG. 1, RDATA[i] corresponds to RDATA of FIG. 1, and WDATA[i] corresponds to WDATA of FIG. 1.

In FIG. 3-A, APS 38-A and PPS 38-B switches connect RDATA[i] or WDATA[i] to the readout block for active or passive readout respectively. However, one can share the readout block between WDATA[i] and RDATA[i+1] or between WDATA[i] and RDATA[i−1]. Also, Rd 38-C switch connects the reset voltage to the WDATA [i]. This enable fast resetting for real time imaging.

For current biasing, APS 38-A and PPS-38B are both close and a biasing current is applied to the circuit through Rd 38-C. However, for voltage biasing, APS 38-A and PPS 38-B can be open.

FIG. 3-B illustrates another example of an array structure including the sensor pixel circuit 10 of FIG. 1. The sensor pixel array system 30 of FIG. 3-B has programming and readout functions for a sensor pixel array 32. The sensor pixel array 32 includes a plurality of sensor pixel circuits corresponding to that of FIG. 1. The sensor pixel array system 30 further includes an address driver 34 and a read out circuit 36.

In FIG. 3-B, VB1[i] corresponds to VB1 of FIG. 1, VB2[i] corresponds to VB2 of FIG. 1, and RDATA[i] corresponds to RDATA of FIG. 1, and WDATA corresponds to WDATA of FIG. 1.

Figure 4:
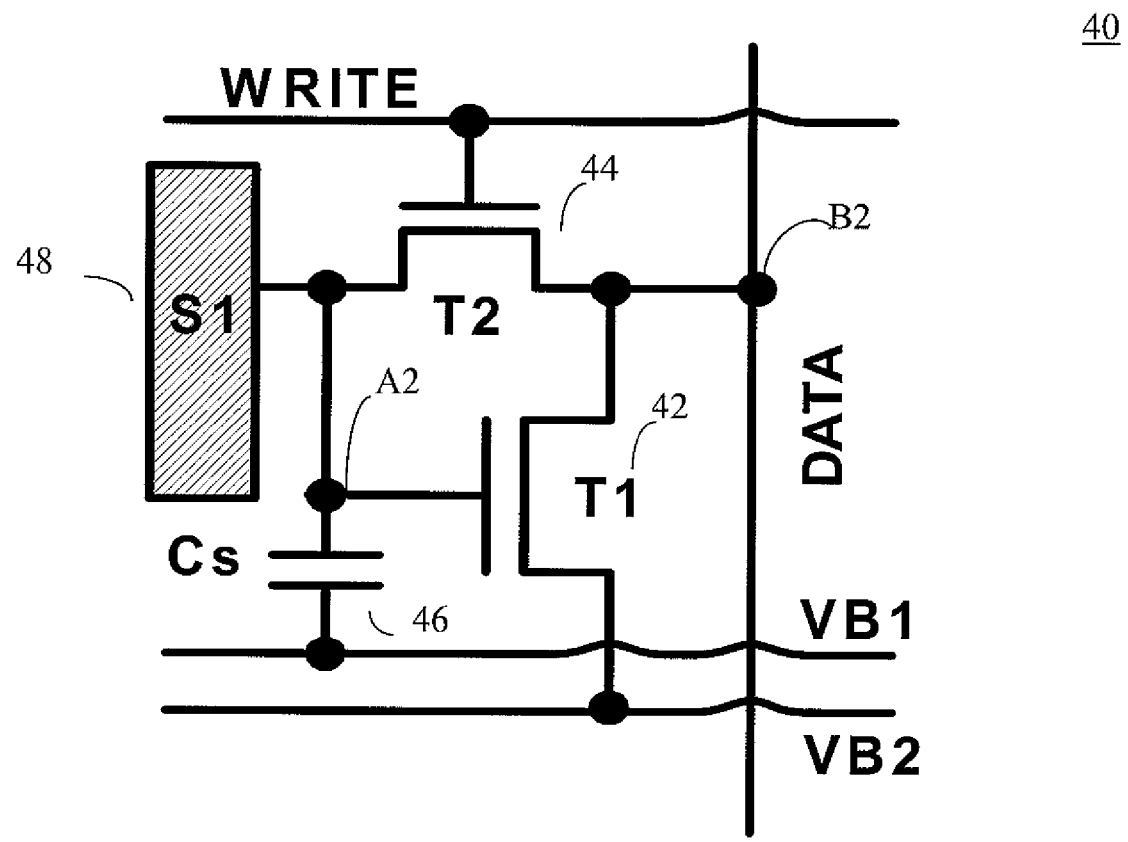
FIG. 4 is a diagram illustrating a sensor pixel circuit in accordance with another embodiment of the present invention.

FIG. 4 illustrates a sensor pixel circuit in accordance with another embodiment of the present invention. The sensor pixel circuit 40 of FIG. 4 includes an amplifying transistor 42, a switch transistor 44, a storage capacitor 46, and a sensor 48. The transistors 42 and 44 are, for example, but not limited to, TFTs (hereinafter referred to as TFT 42, TFT 44, respectively), and each has first and second terminals and a gate terminal. In this embodiment, the pixel circuit 40 is a 2-TFT sensor pixel circuit and may form an active matrix array. The sensor 48 may be similar or the same as the sensor 18 of FIG. 1. It is well understood by one of ordinary skill in the art that the NMOS transistor in the pixel 40 can be replaced with a PMOS transistor using the concept of complementary circuit design.

The first terminal of TFT 42 is connected to a data line DATA, and the second terminal of TFT 42 is connected to a bias line VB2. The first terminal of TFT 44 is connected to the data line DATA, and the second terminal of TFT 44 is connected to the gate terminal of TFT 42 at node A2. The gate terminal of TFT 44 is connected to a write line WRITE. The storage capacitor 46 is connected to the node A2 and a bias line VB1. The sensor 48 is connected to the node A2. In this pixel circuit 40, one DATA line is used instead of two data lines WDATA and RDATA of FIG. 1.

The sensor pixel circuit 40 is biased using a biasing current, resulting in that mismatching and aging effects of the sensor pixel circuit is reduced. The biasing current is applied to the pixel 40 during the first operating cycle, while SEL is high, a current is applied to data[i] and the gate voltage.

One example of operating cycles for the sensor pixel circuit 40 is illustrated in FIG. 5. Referring to FIGS. 4-5, the operation of the sensor pixel circuit 40 includes three operating cycles 52, 54, and 56. This driving scheme provides a low noise, high sensitivity, and low power (consumption) sensor.

During the first operating cycle 52, the node A2 is charged to a biasing voltage (VP). In this pixel circuit 40, a current can be used for biasing to manage the mismatches, aging effects and temperature variations. Hence, VB1 and VB2 change to V11 and V21 to turn on TFT 42 for biasing with a current. VP/IP for DATA in FIG. 5 indicates that the biasing signal can be either a voltage (VR) or a current (IR). If a biasing voltage is used, V11 can be zero and V21 can be VR. Thus, TFT 42 (T1) will be off resulting in lower power consumption and lower leakage. If a biasing current is used. V11 can be higher than zero, and V21 is zero. Here, TFT 42 (T1) is ON and allows the biasing current passes through it. Also, the pixel may be reset by a larger current than actual required current to improve the settling time.

During the second operating cycle 54, a sensor signal generated by the sensor 48 changes the voltage at node A2. During the third operating cycle 56, a current/voltage is applied to DATA while the bias lines VB1 and VB2 goes to V12, V22 respectively to turn on TFT 42. V12 is zero and V22 is VR and so T1 is off during this cycle, thus power consumption drops and T1 does not age. Also, if a biasing current is used during previous operating cycle 54, by bringing VB1 from V11 (non-zero) to V12 (zero), the pixel current is reduced to the required current.

During the third operating cycle 56, VB2 is zero and so T1 is ON. Since it gate voltage is modified by the sensor, its drain current changes accordingly. Thus, T1 current can be read as a representative of the sensor signal.

The operation of FIG. 5 includes the second operating cycle 54 and the third operating cycle 56. However, in another example, the second and third operating cycles 54 and 56 may be repeated with and without sensor effects, correlated double sampling (CDS), to manage the leakage current and low frequency noise effects.

A pixel array system for an array having the sensor pixel 40 of FIG. 4 may be similar to the pixel array system 30 of FIG. 3. FIG. 6-A illustrates one example of an array structure for the pixel 40 for voltage biasing. FIG. 6-B illustrates another example of an array structure for the pixel 40 for current biasing.

Figure 7:
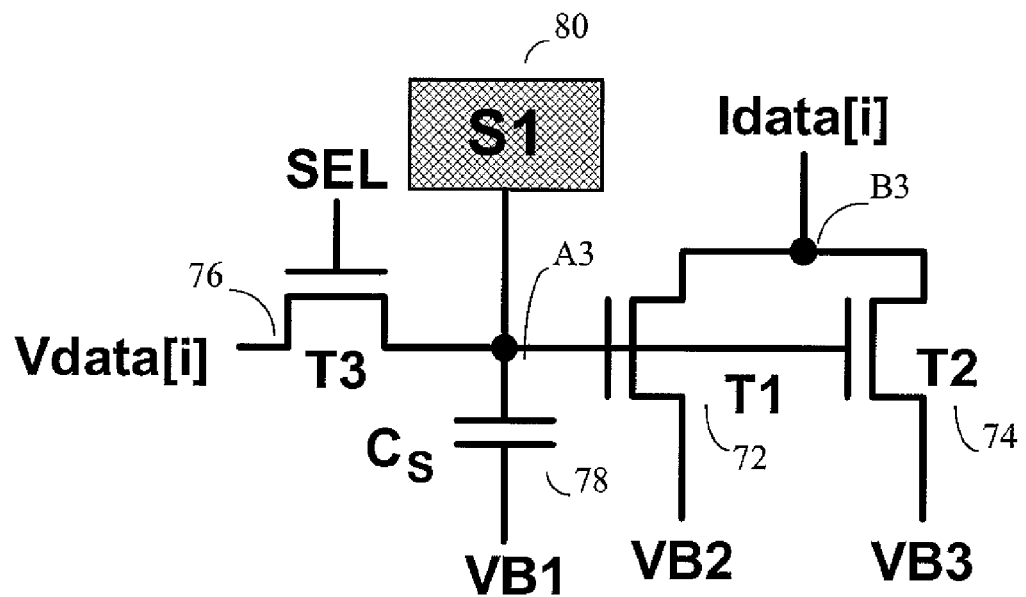
FIG. 7 is a diagram illustrating a sensor pixel circuit in accordance with a further embodiment of the present invention.

FIG. 7 illustrates a sensor pixel circuit in accordance with a further embodiment of the present invention. The pixel circuit 60 of FIG. 7 includes two amplifying transistors 72 and 74, a switch transistor 76, a storage capacitor 78, and a sensor 80. The transistors 72, 74, and 76 are, for example, but not limited to, TFTs (hereinafter referred to as TFT 72, TFT 74, TFT 76, respectively), and each has first and second terminals and a gate terminal. The pixel circuit 60 is a 3-TFT sensor pixel circuit and may form an active matrix array. The sensor 80 may be similar or the same as the sensor 18 of FIG. 1. It is well understood by one of ordinary skill in the art that the NMOS transistor in the pixel 60 can be replaced with a PMOS transistor using the concept of complementary circuit design.

The first terminal of TFT 72 is connected to a data line Idata[i], and the second terminal of TFT 72 is connected to a bias line VB2. The first terminal of TFT 74 is connected to the data line Idata[i], and the second terminal of TFT 74 is connected to a bias line VB3. The first terminal of TFT 76 is connected to a data line Vdata[i], and the gate terminal of TFT 76 is connected to a select line SEL. The second terminal of TFT 76 is connected to the gate terminals of TFTs 72 and 74 at node A3. The storage capacitor 78 is connected to VB1. The storage capacitor 78 and the sensor 80 are connected to node A3. "i" represents, for example, the ith column in an array for the pixel.

Figure 8:
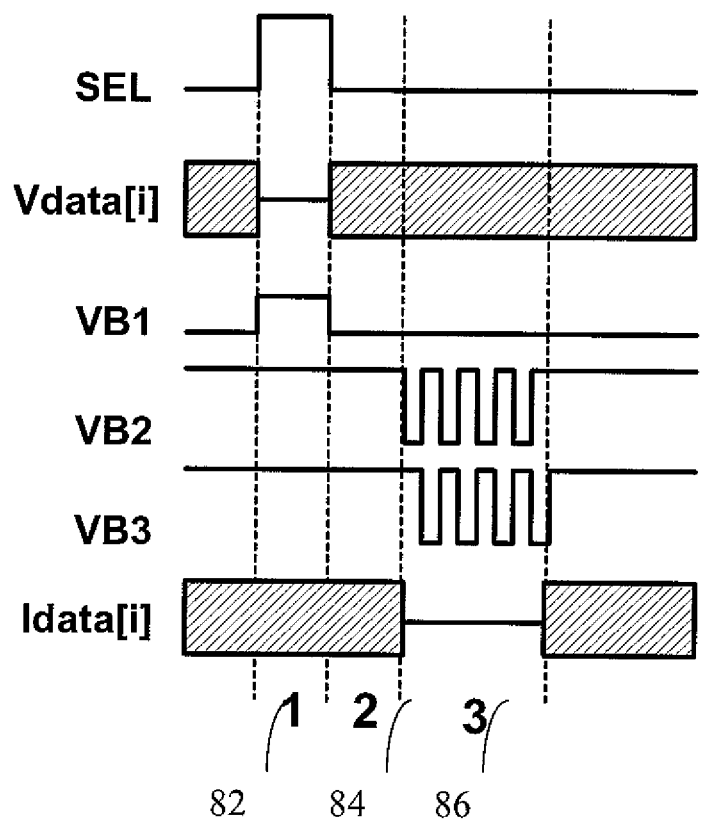
FIG. 8 is a timing chart illustrating an example of waveforms applied to the pixel circuit of FIG. 7.

One example of operating cycles for the pixel circuit 60 is illustrated in FIG. 8. The operating cycles of the pixel circuit 60 includes a first operating cycle 82, a second operating cycle 84, and a third operating cycle 86. The third operating cycle 86 is a read cycle (or readout cycle, hereinafter referred to as read cycle).

The switch biasing technique is applied during the read cycle 86. The switch biasing technique reduces the low frequency noise. This driving technique provides low noise, high sensitivity and low power detection.

Referring to FIGS. 7 and 8, during the first operating cycle 82, the storage capacitor 78 is charged to a biasing voltage (VR) by setting SEL, Vdata[i], VB1, VB2, VB3, Idata [i] to a high voltage (VH), VR, zero, VR, VR, and VR, respectively. If a biasing current is used, the storage capacitor 78 is charged to a biasing voltage (VR) by setting SEL, Vdata[i], VB1, VB2, VB3, Idata [i] to a high voltage (VH), VR, a voltage larger than zero, zero, zero, and VR, respectively. This biasing condition provides for low leakage current, longer TFT lifetime, and lower power consumption. However, the biasing condition can change to other values as well.

During the second cycle 84, SEL, Vdata[i], VB1, VB2, VB3, Idata [i] are set to a low voltage (VL), VR, zero, VR, VR, and VR respectively. This biasing condition provides for low leakage current, longer TFT lifetime, and lower power consumption. During the second cycle 84, the sensor signal from the sensor 80 is integrated by the storage capacitor 78.

During the read cycle 86, VB2 and VB3 are set to be high and low, alternately. During the readout cycle 86, TFTs 72 and 74 turn on sequentially. Thus, the output signal of Idata[i] is not affected by the sync filter induced by the switch biasing and it is essentially equivalent to a single TFT with a DC bias.

In FIG. 7, the sensor pixel circuit 60 includes two amplifying transistors 72 and 74. However, in another embodiment, the sensor pixel circuit may use one TFT (TFT 72 or TFT 74 of FIG. 7) to improve the aperture ratio and use a higher bias voltage to compensate for the gain lost by the switch biasing technique. Thus only one bias line VB2 (or VB3) is used. In this case, VB2 is oscillated as shown in FIG. 8. On the other hand, the noise is reduced significantly due to the reduction of carrier trapping/de-trapping phenomena intrinsic to most transistors. Moreover, the lifetime of the pixel is improved as well.

Figure 9:
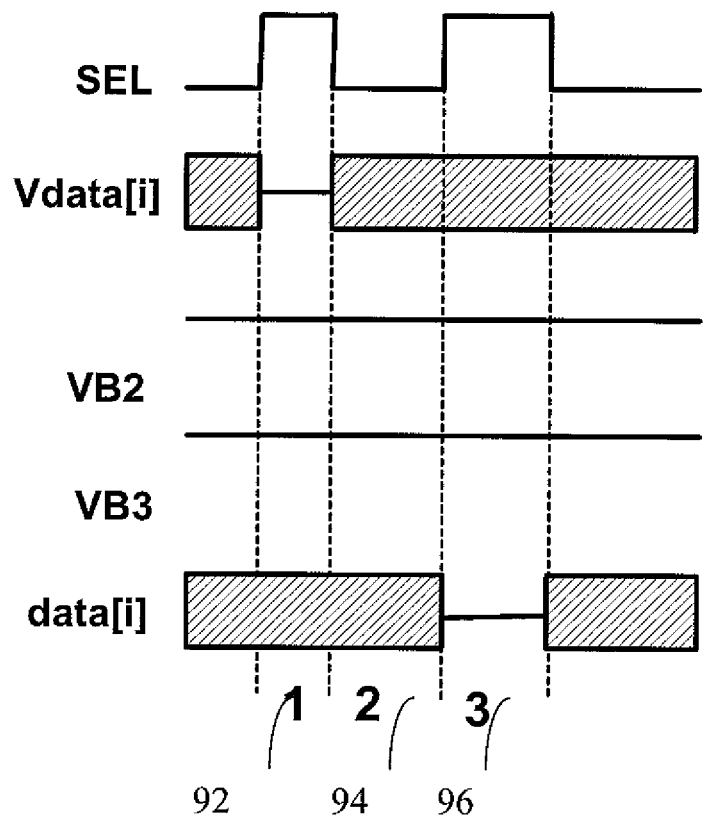
FIG. 9 is a timing chart illustrating another example of waveforms applied to pixel sensor circuits.

The pixel circuits 60, 40, and 10 can work in hybrid mode which means it can be passive or active. For passive operation, VB2 and VB3 are chosen to be the voltage applied to Idata and so they are OFF as shown in FIG. 9 Therefore, the integrated signal can be read back through Vdata. For active operation, Here, data[i] is Wdata for pixel circuit 10, DATA for pixel circuit 40 and Vdata[i] for pixel circuit 60.

During the first operating cycle 92, storage capacitor is reset to a biasing voltage (VR). During the second operating cycle 94, the sensor signal is integrated by the storage capacitor. During the third operating cycle 96, the integrated signal is readout through data[i].

An array structure for the pixel 60 of FIG. 7 may be the same as that of FIG. 3A or FIG. 3B.

Figure 10:
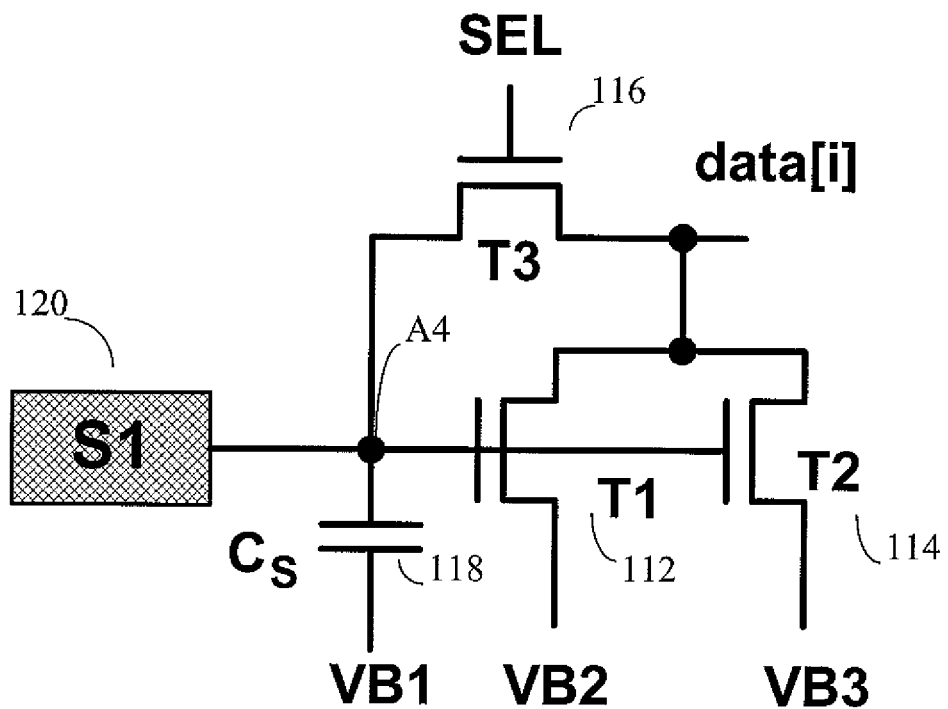
FIG. 10 is a diagram illustrating a sensor pixel circuit in accordance with a further embodiment of the present invention.

FIG. 10 illustrates a sensor pixel circuit in accordance with a further embodiment of the present invention. The sensor pixel circuit 100 of FIG. 10 includes two amplifying transistors 112 and 114, a switch transistor 116, a storage capacitor 118, and a sensor 120. The transistors 112, 114, and 116 are, for example, but not limited to, TFTs (hereinafter referred to as TFT 112, TFT 114, TFT 116, respectively), and each has first and second terminals and a gate terminal. The pixel circuit 100 is a 3-TFT sensor pixel circuit and may form an active matrix array. The sensor 120 may be similar or the same as the sensor 18 of FIG. 11t is well understood by one of ordinary skill in the art that the NMOS transistor in the pixel 100 can be replaced with a PMOS transistor using the concept of complementary circuit design.

The first terminal of TFT 112 is connected to a data line data[i], and the second terminal of TFT 112 is connected to a bias line VB2. The first terminal of TFT 114 is connected to the data line data[i], and the second terminal of TFT 114 is connected to a bias line VB3. The first terminal of TFT 116 is connected to the data line data[i], and the gate terminal of TFT 116 is connected to a select line SEL. The second terminal of TFT 116 is connected to the gate terminals of TFTs 112 and 114 at node A4. The first terminal of the capacitor 118 is connected to VB1. The storage capacitor 118 and the sensor 120 are connected to node A4. "i" represents, for example, the ith row in an array for the pixel.

Figure 11:
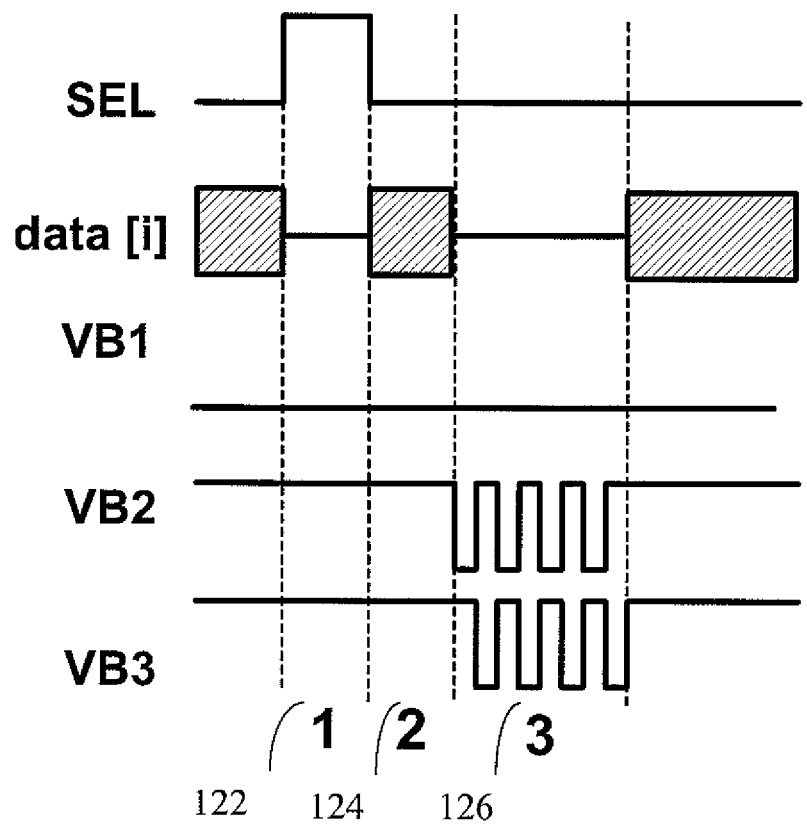
FIG. 11 is a timing chart illustrating an example of waveforms applied to the sensor pixel circuit of FIG. 10.
Figure 12:
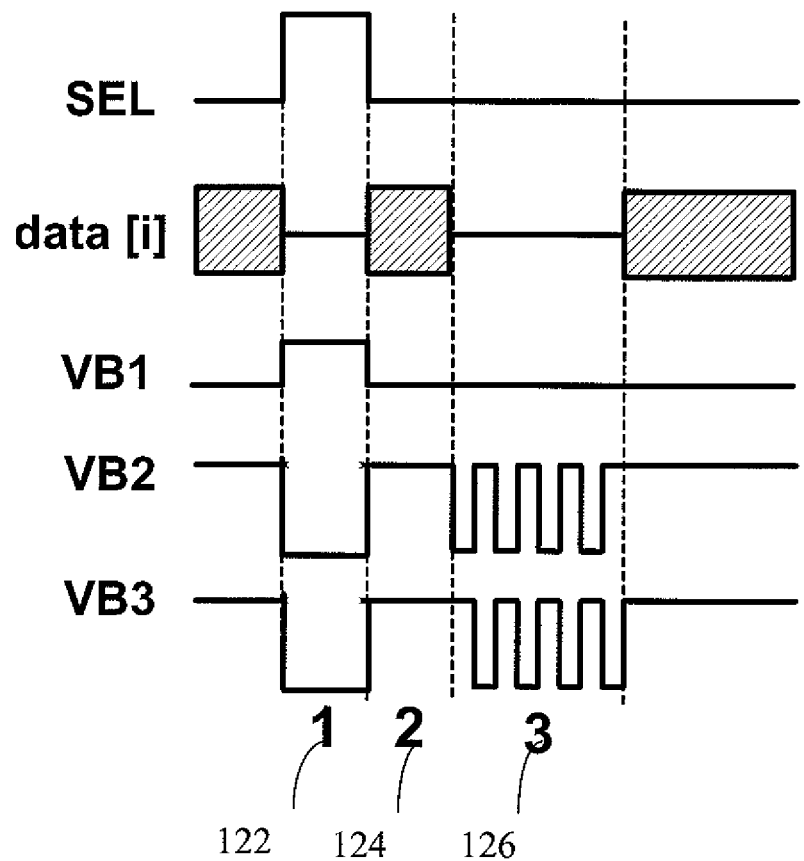
FIG. 12 is a timing chart illustrating another example of waveforms applied to the sensor pixel circuit of FIG. 10.

Examples of operating cycles for the pixel circuit 100 are illustrated in FIG. 11 (voltage biasing) and FIG. 12 (current biasing). The operating cycles of the pixel circuit 100 includes a first operating cycle 122, a second operating cycle 124 and a third operating cycle 126. The third operating cycle 126 is a read cycle (or readout cycle.).

The switch biasing technique is applied during the read cycle 126. The switch biasing technique reduces the low frequency noise. It is also able to control the effect of leakage current by reducing the drain-source voltage to zero as described below. This driving technique provides low noise, high sensitivity and low power detection.

Referring to FIGS. 11 and 12, during the first operating cycle 122, the storage capacitor 118 is charged to a biasing voltage (VR) by applying a voltage or current to the data line data[i]. When using current as the biasing signal, VB2 and VB3 are set to be zero during the first operating cycle 122. When using voltage as the biasing signal, VB2 and VB3 can be as the voltage of data[i] to reduce power consumption.

During the second cycle 124, SEL, data[i], VB1, VB2, and VB3 are set to a high voltage (VH), reset voltage (VR), zero, VR, and VR respectively. For current biasing (FIG. 12), SEL, data[i], VB1, VB2, and VB3 are set to a high voltage (VH), reset voltage (VR), VB(>zero), zero, and zero respectively. During the second cycle 124, the sensor signal from the sensor 120 is integrated by the storage capacitor 118.

During the read cycle 126, TFTs 112 and 114 turn on sequentially. Thus, the output signal of TFT 112 (T1) and TFT 114 (T2) is not affected by the sync filter caused by the switch biasing and it is essentially equivalent to a single TFT with a DC bias.

In FIG. 10, the sensor pixel circuit 100 includes two amplifying transistors 112 and 114. However, in another embodiment, the sensor pixel circuit may use one TFT (TFT 112 or TFT 114 of FIG. 10) to improve the aperture ratio and use a higher bias voltage to compensate for the gain lost by switch biasing technique. In this case, only one bias line VB2 (or VB3) is used, and VB2 (VB3) is oscillated as shown in FIG. 11 or 12. On the other hand, the noise is reduced significantly due to the reduction of carrier trapping/de-trapping phenomena intrinsic to most transistors. Moreover, the lifetime of the pixel is improved as well.

The pixel 100 can work in hybrid mode which means it can be passive or active. For passive operation, VB2 and VB3 are chosen to be the voltage applied to data[i] and so they are OFF as shown in FIG. 12. Therefore, the integrated signal can be read back through data[i]. For active operation, A pixel array system for an array having the sensor pixel 100 of FIG. 10 may be the same as that of FIG. 6-A or 6-B.

Figure 13:
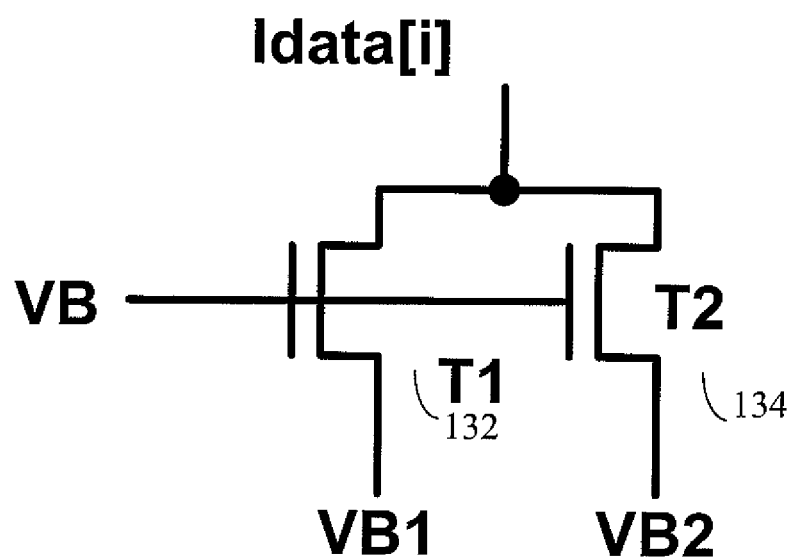
FIG. 13 is a diagram illustrating a sensor pixel circuit in accordance with a further embodiment of the present invention.

FIG. 13 illustrates a sensor pixel circuit in accordance with a further embodiment of the present invention. The sensor pixel circuit 130 of FIG. 13 includes two amplifying transistors 132 and 134. The transistors 132 and 134 are photo transistors, for example, but not limited to, photo TFTs (hereinafter referred to as TFT 132, TFT 134, respectively), and each has first and second terminals and a gate terminal. The pixel circuit 130 is a 2-TFT photo pixel circuit and may form an active matrix array. It is well understood by one of ordinary skill in the art that the NMOS transistor in the pixel 130 can be replaced with a PMOS transistor using the concept of complementary circuit design. Again, the photo transistors may be other forms of transistor as mentioned previously to sense other environmental conditions, such as for example temperature, x-rays or chemicals.

The first terminal of TFT 132 is connected to a data line Idata[i], and the second terminal of TFT 132 is connected to a bias line VB1. The first terminal of TFT 134 is connected to the data line Idata[i], and the second terminal of TFT 134 is connected to a bias line VB2. The gate terminal of each TFT is connected to a select line VB. VB is a bias voltage connected to a DC voltage; however, in some applications an AC signal can be applied to it as well.

Figure 14:
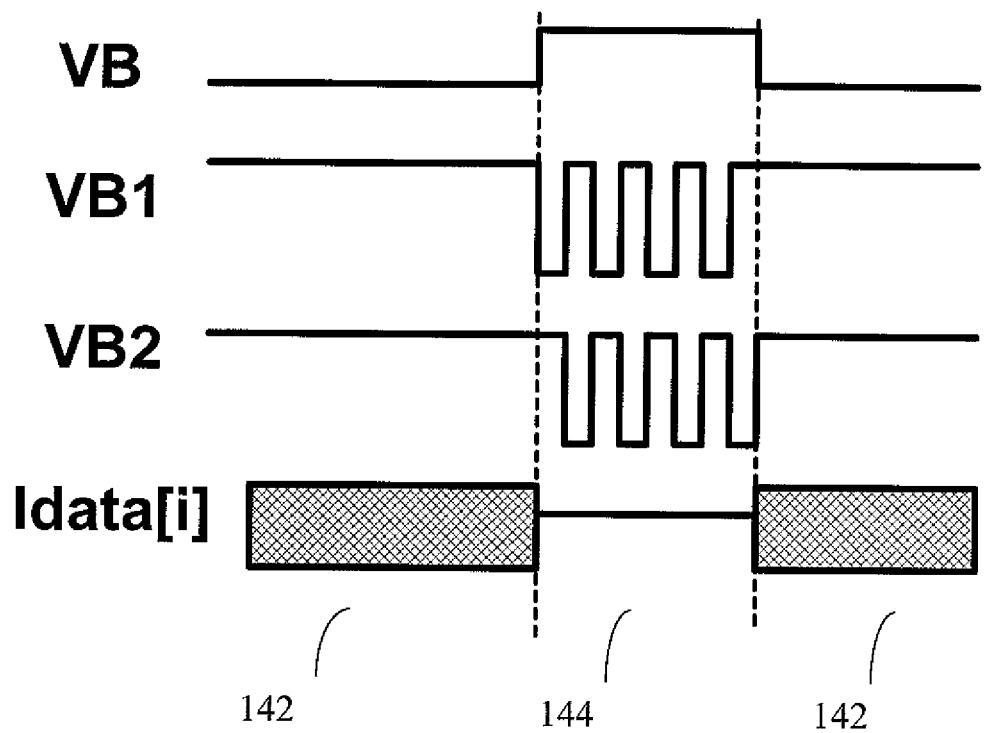
FIG. 14 is a timing chart illustrating an example of waveforms applied to the sensor pixel circuit of FIG. 13.

One example of operating cycles for the pixel circuit 130 is illustrated in FIG. 14. Referring to FIGS. 13-14, the operation of the photo pixel circuit 130 includes tow operating cycles 142 and 144. The operating cycles 142 and 146 are reset cycles. The second operating cycle 144 is an readout cycle. It is noted that an AC signal is illustrated for VB1 and VB2 in FIG. 14 for the sake of generality.

The switch biasing technique is applied during the second operating cycle 144. The switch biasing technique reduces the low frequency noise. This driving technique provides low noise, high sensitivity and low power consumption.

During the first operating cycle 142, the drain-source ($V_{DS}$) and gate-source ($V_{GS}$) voltages are zero to reduce electrical stress for increased stability and lifetime by setting, for example, Idata[i]=15V, VB=15V, VB1=15V and VB2=15V. Moreover, the leakage current is zero since $V_{DS}$ and $V_{GS}$ are zero, leading to relatively lower cross talk from adjacent pixels in the same column.

During the second operating cycle 144, the voltage level of each VB1 and VB2 is switched. TFT 132 and TFT 134 are turned on and off alternately, providing current to Idata[i] in turn while their channel conductance is modulated as a result of optical interaction. Thus, the output signal of T1 and T2 is not affected by any sync filter induced by using a pulse signal in the switch biasing; while the signal is otherwise essentially equivalent to the output of a single TFT with a DC bias.

During the third operating cycle 146, VB1 and VB2 are set to VR (e.g. 15V). Idata is set to VR and VB is set to zero. Thus, T1 and T2 experience no stress resulting in longer lifetime and more stability.

In FIG. 13, the sensor pixel circuit 130 includes two photo transistors 132 and 134. However, in another embodiment, the sensor pixel circuit may use one photo TFT alone (TFT 132 or TFT 134) to improve the aperture ratio and use a higher bias voltage to compensate for gain lost by alternating the switch biasing. Again, only one bias line VB1 (or VB2) is used. In this case, VB1 is oscillated as shown in FIG. 13.

Figure 15:
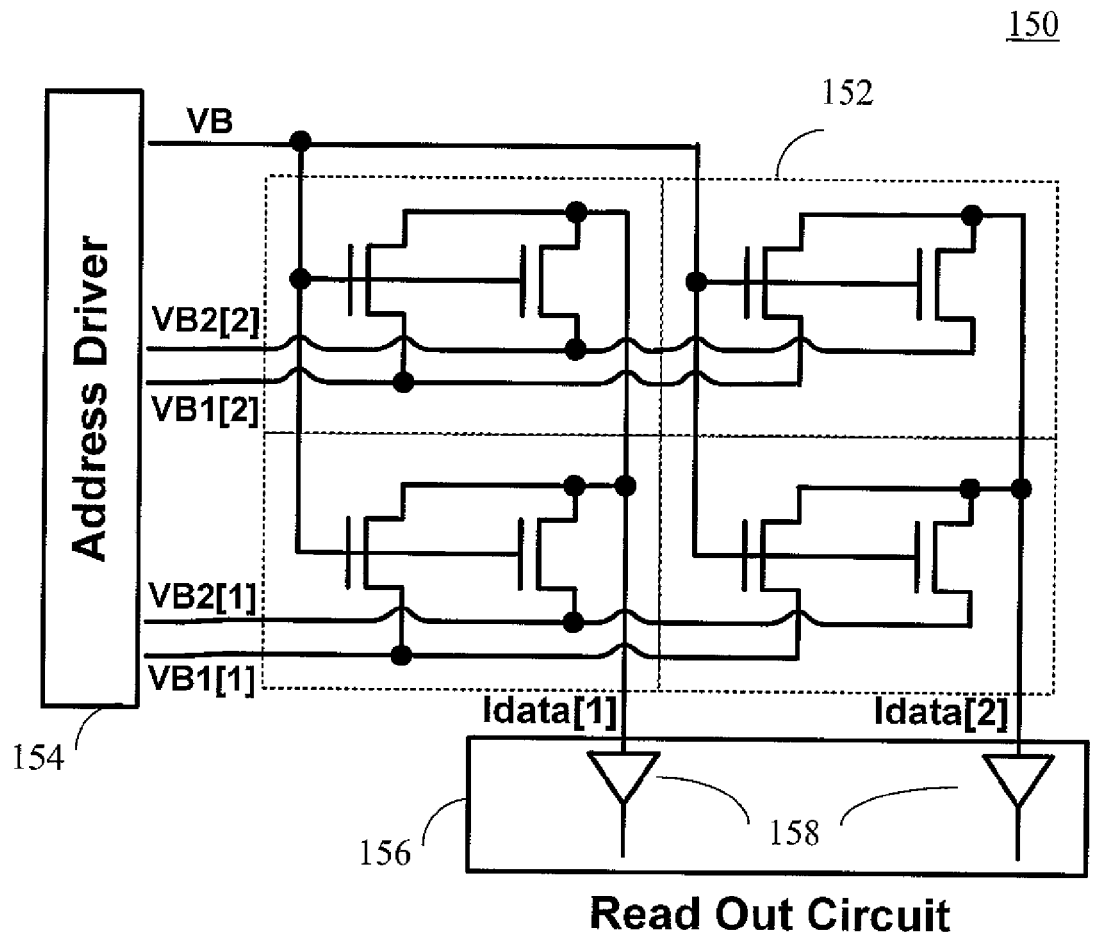
FIG. 15 is a diagram illustrating an example of an array system including the sensor pixel circuit of FIG. 13.

FIG. 15 illustrates an example of an array structure including the photo pixel circuit 130. The pixel array system 150 of FIG. 15 includes a photo pixel array 152, an address driver 154 and a read out circuit 156. The photo pixel array 152 includes a plurality of photo pixel circuits, each corresponding to that of FIG. 13. In FIG. 15, four pixel circuits (2×2 array structure) are shown as an example.

In FIG. 15, VB1[i] (i=1, 2, ...) represents a bias line for the ith row and corresponds to VB1 of FIG. 15; VB2[i] represents another bias line for the ith row and corresponds to VB2 of FIG. 13; and Idata [j] (j=1, 2, ...) represents a data line for the jth column and corresponds to Idata[i] of FIG. 13. VB, VB1[i] and VB2[i] are driven by the address driver 154. Idata[j] is read by the read out circuit 156.

A row is selected by applying a pulse to its corresponding VB1 and VB2 lines (e.g. VB1[1] and VB2[1]). The output current of each pixel in a selected row is read out by a transresistance or charge amplifier 158.

The sensor pixel circuit 130 and its operation scheme can provide high responsivity to near infra-red (NIR) and ultra-violet (UV) wavelengths critical for a variety of imaging applications. One important requirement for in-vivo bio-molecular imaging applications, can be sensitivity to near infrared (NIR, 700-900 nm). This region of the spectrum enables penetration through tissue, to provide more accurate diagnostics. Sensitivity to UV provides a better choice of better quantum efficiency scintillation layers for x-ray imaging applications, besides direct UV sensing/imaging applications. The particular structure of the circuit 130 utilizing an a-Si: H imager provides sensitivity in this region. Also, the sensitivity is amplified utilizing the biasing herein.

Figure 16:
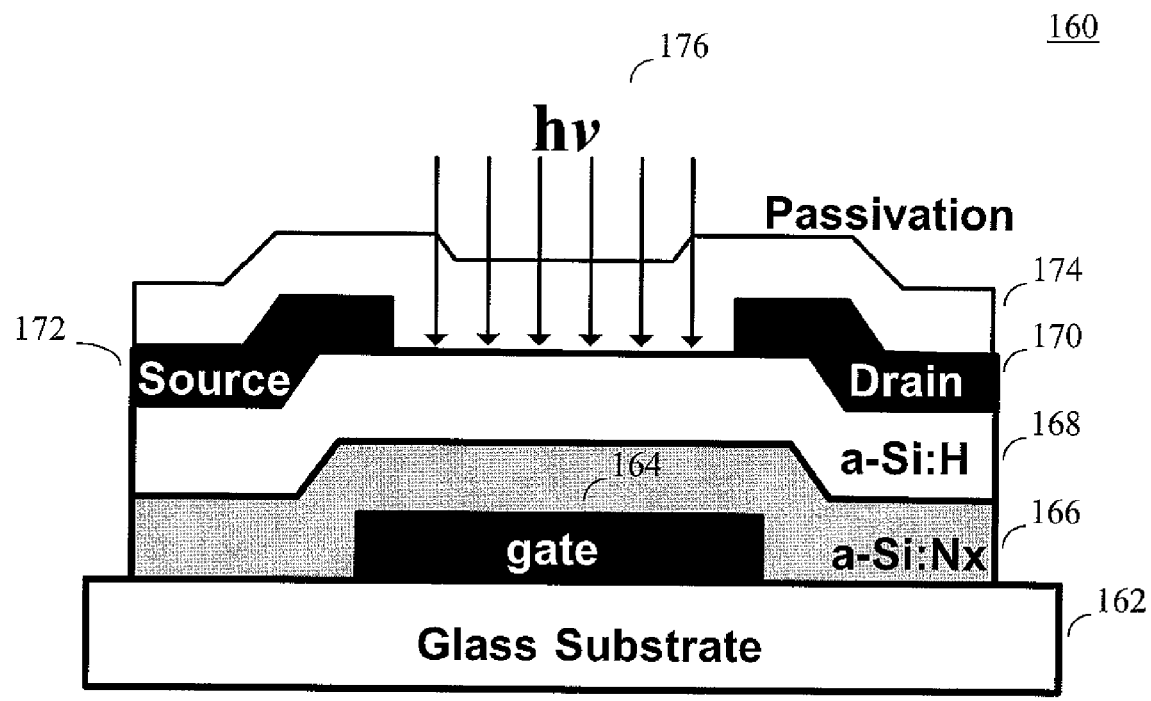
FIG. 16 is a diagram illustrating the structure of an inverted staggered photo thin film transistor (TFT) used as a photo-detector.

FIG. 16 illustrates the structure of an example photo-thin film transistor (TFT) used as a photo-detector. As will be discussed below, the TFT 160 exhibits some trap-assisted absorption. Other TFTs can be structured to exhibit trap-assisted absorption. Such TFTs are particularly well suited to use in the pixel circuits described herein as they can result in smaller trapping time and consequently larger current. However, it is not necessary to use trap-assisted TFTs generally, nor this particular TFT 160, to take advantage of other techniques described herein, such as flicker reduction and TFT aging effect reduction or compensation. Other TFTs could be used when taking advantage of flicker reduction and aging effect reduction or compensation. TFT 160 of FIG. 16 includes a glass substrate 162, a gate 164 deposited on the glass substrate 162, a-Si:Nx layer 166 and a-Si:H layer 168 deposited on the gate 164, a drain electrode 170 and a source electrode 172 deposited on the a-Si:H layer 168, and a passivation layer 174 deposited on the source and drain electrodes 170 and 172. TFT 160 is exposed to photons 176 through the passivation layer 174.

TFT 160 is an inverted staggered a-Si:H photo-TFT with 300 nm a-Si:Nx layer 166 and 50 nm a-Si:H layer 168 fabricated using plasma enhanced chemical vapor deposition (PECVD). The aspect ratio of TFT 160 is 800 pm/23 μm.

To reduce the effects of TFT aging on photocurrent ($I_{illumination} - I_{dark}$), the dark current is extracted before each measurement. As the gate voltage passes the sub-threshold regime, the responsivity to red illumination increases as shown in FIG. 17.

Figure 17:
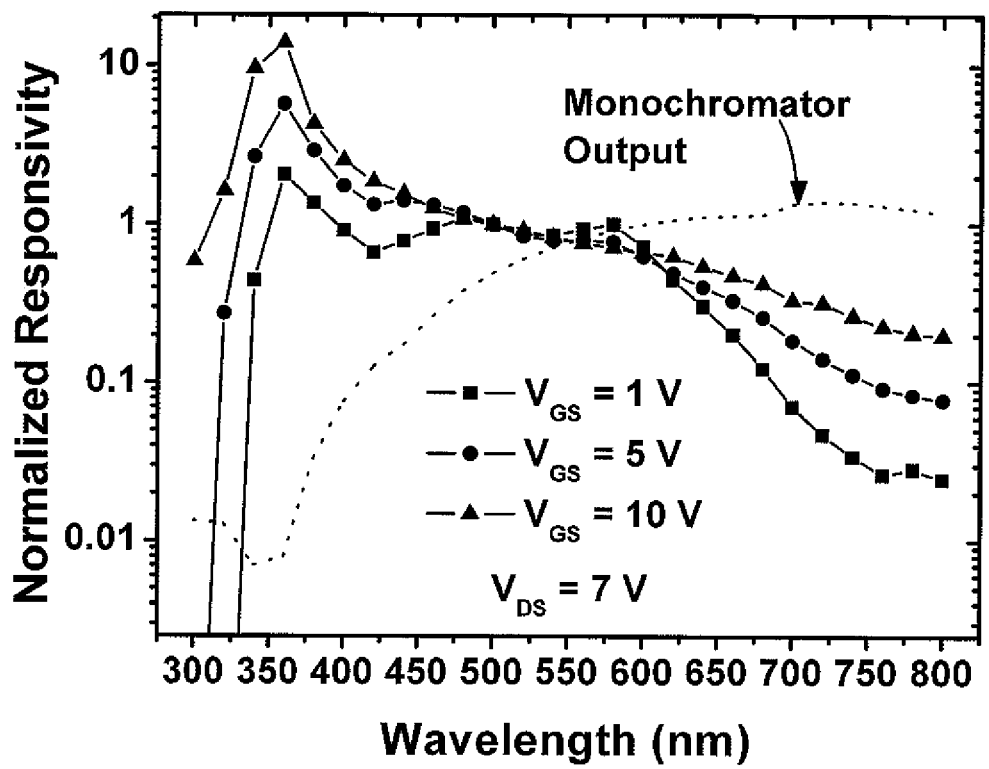
FIG. 17 is a graph showing an effect of bias on the responsivity of the photo TFT.

FIG. 17 illustrates an effect of bias on the responsivity of the a-Si:H photo-TFT 160 of FIG. 16. In FIG. 17, "$V_{GS}$" represents the gate-source voltage of the photo-TFT, and "$V_{DS}$" represents the drain-source voltage of the photo-TFT. The responsivity of the Si:H TFT is extracted by using an arc lamp (for example, an arc lamp sold under the trademark Oriel 66181) in series with a monochromator (for example, a monochromator sold under the trademark Oriel 77200), both calibrated with a silicon sensor (for example, a sensor sold under the trademark Newport 818-UV). The measured photocurrents are normalized to the photocurrent at 500-nm.

Referring to FIGS. 16-17, this is most likely due to trap-assisted absorption in which the photons are absorbed by the trapped electrons resulting in a smaller trapping time and consequently larger current. Also, the TFT photo-sensor provides high sensitivity to the ultra violet range.

Figure 18:
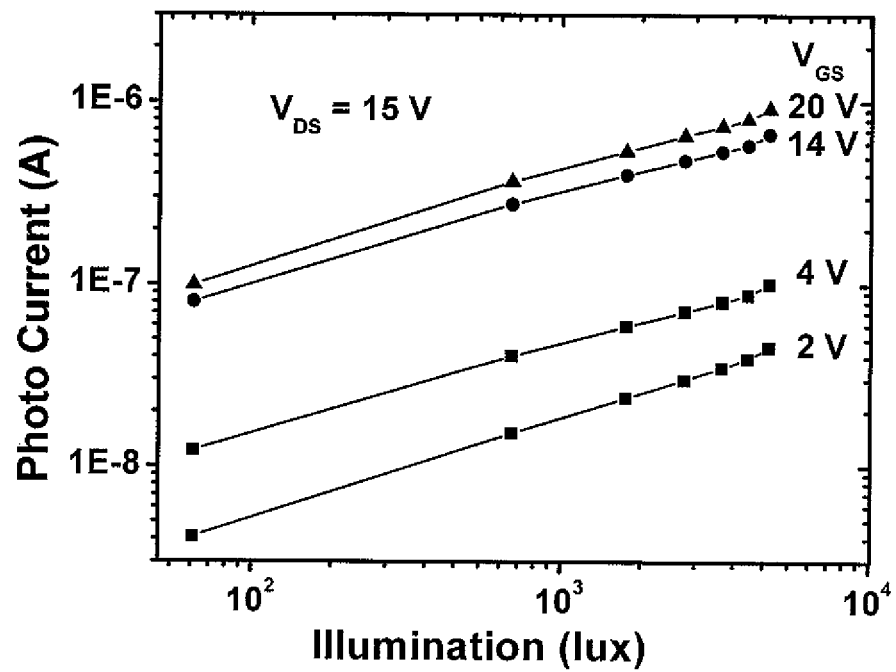
FIG. 18 is a graph showing the photocurrent of the photo TFT as a function of illumination intensity for various gate biases.

FIG. 18 illustrates the photocurrent of the TFT 160 as a function of illumination intensity for various gate biases. In FIG. 18, "$V_{GS}$" represents the gate-source voltage of the photo-TFT, and "$V_{DS}$" represents the drain-source voltage of the photo-TFT. The illumination is generated by a red LED (for example, an LED sold under the trademark Avago Tech. HLMP-1301) with a peak at 635-nm wavelength. The sensitivity of photo-TFT 160 increases as the gate voltage increases. The photocurrent is significantly high (>50 nA) even at low intensities which is critical for high dynamic range, high precision imaging.

Referring to FIGS. 16-18, a photo pixel circuit 130 of FIG. 13 having the TFT structure 160 can be utilised as a bio-molecular pixel circuit. Although the structure 160 of FIG. 16 can be used for any TFTs herein, the biasing techniques and age effect reduction and compensation techniques described herein can be used with other TFT structure as well as appropriate. In this embodiment, the pixel circuit 130 with the TFT 160 is designed and operated to deploy trap-assisted absorption in the TFT while lowering the 1/f noise and aging. These are attributes which can be exploited for various other sensing architectures for a variety of other imaging applications.

The photo pixel circuit 130 having TFT structure 160 shows enhanced responsivity of an a-Si:H thin film transistor (photo-TFT) to the near-infrared (NIR) and ultra-violate (UV) range of the optical spectrum by a means of trap-assisted absorption. Because the responsivity to UV is improved, it enables extensions of the imaging space to large area UV sensing and imaging.

A flicker noise (1/f) of the pixel is reduced by adopting the switch biasing technique. As the pixel provides for large in-pixel amplification, the integration time is diminished, limiting background noise stemming from dark current. Large in-pixel amplification results from applying alternating biasing to the transistors (T1 and T2) where the transistors (T1 and T2) are each amplification and sensing elements The pixel circuit 130 having TFT structure 160 is designed and operated to deploy trap-assisted absorption in the TFT while lowering the 1/f noise and aging. These are attributes which can be exploited for various other sensing architectures for a variety of other imaging applications.

The technique applied to the pixel circuit 130 provides an economical solution to imaging as the image sensor and readout technique can be implemented in standard amorphous silicon flat panel technology.

Figure 19:
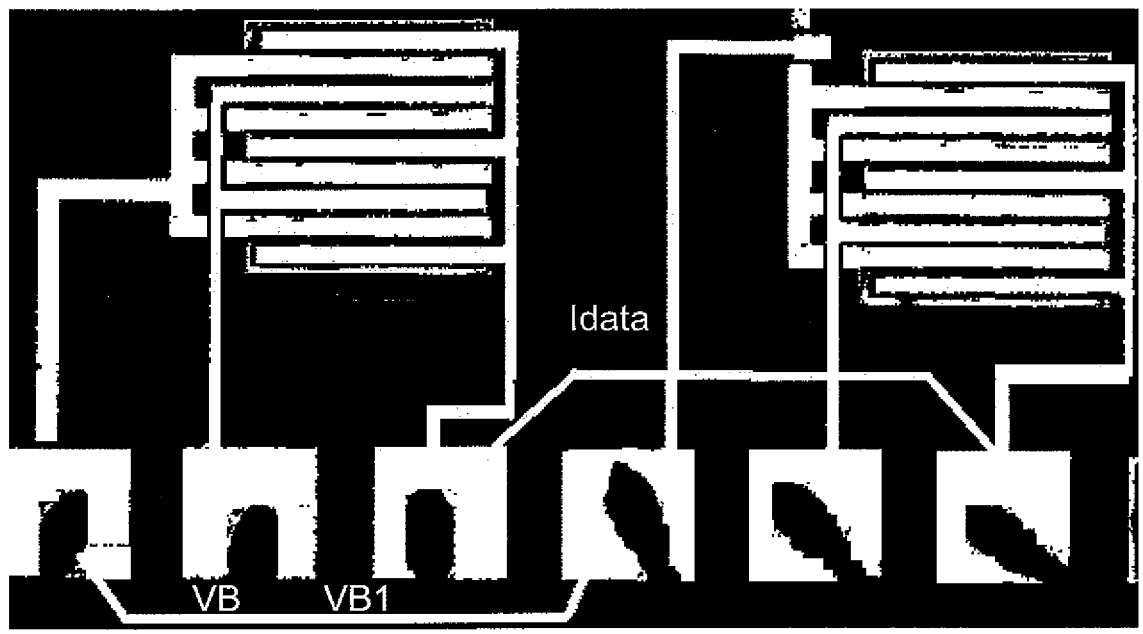
FIG. 19 is a photomicrograph of the photo pixel circuit.

FIG. 19 is a photomicrograph of an example integrated circuit implementation of the photo pixel circuit 130 assembled from discrete TFTs for test purposes. It is to be recognized that this is an example integrated circuit embodiment only and other embodiments can take on different forms as will be evident to those skilled in the art.

Figure 20A:
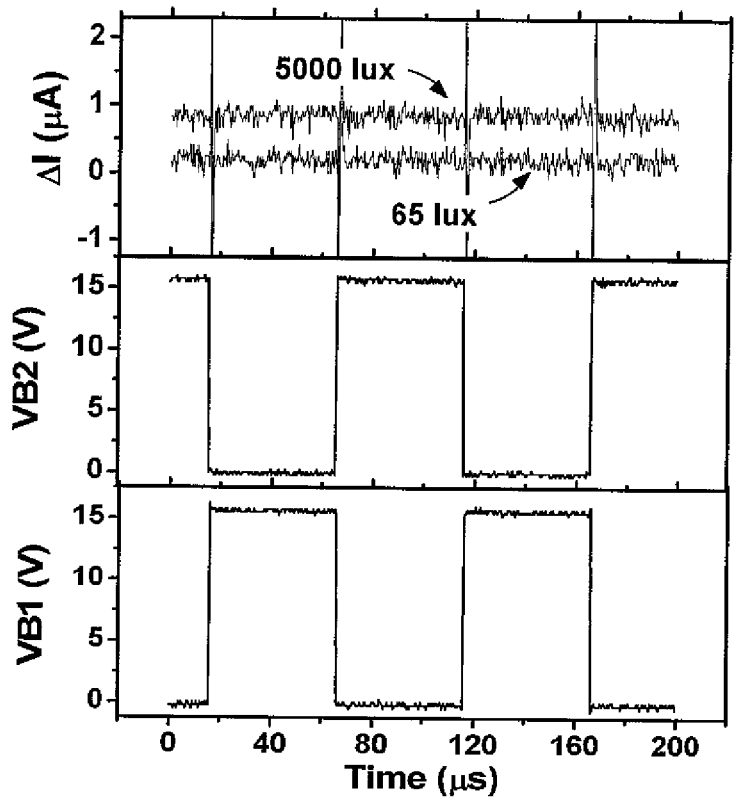
FIG. 20A is a graph showing waveforms in a read cycle of the photo pixel circuit of FIG. 13 for two different illumination conditions.

FIGS. 20A-21B show simulation conditions and the corresponding results. The waveforms of the read cycle (e.g., 144 of FIG. 14) for the switch biasing are shown in FIG. 20A. The photocurrent of the photo pixel circuit for two different illumination conditions is shown in FIG. 20B. To extract the photocurrent a trans-resistance amplifier with a gain of 48 KΩ is used as the readout circuitry (e.g., 156 of FIG. 15). FIG. 20A illustrates a transient waveform while FIG. 20B illustrates sensitivity for the above example implementation of photo pixel circuit 130 under the biasing example described.

Figure 20B:
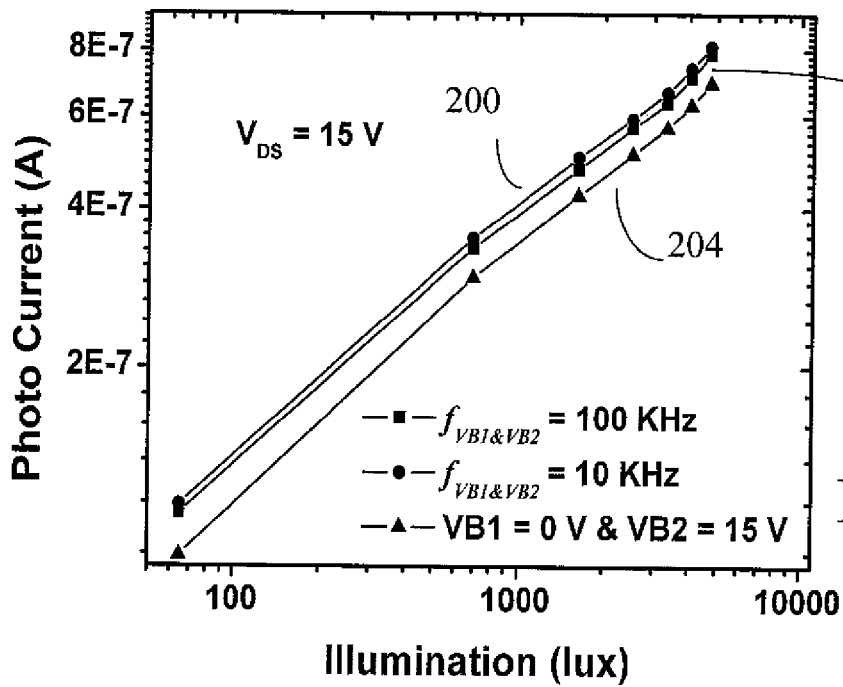
FIG. 20B is a graph showing the simulation results for the photocurrent of the photo pixel circuit of FIG. 13.

In FIG. 20A, VB1 and VB2 are voltages for the bias lines VB1 and VB2; and ΔI represents the photo current. In FIG. 20B, $f_{VB1 \& VB2}$ represents a switching frequency of VB1 and VB2. The line 200 of FIG. 20B shows photocurrent when $f_{VB1 \& VB2}$=100 KHz for the switch biasing. The line 202 of FIG. 20B shows photocurrent when $f_{VB1 \& VB2}$=10 KHz for the switch biasing. The line 204 of FIG. 20B shows photocurrent when VB1=0V and VB2=15V, for comparison.

As shown in FIG. 20B, the switch biasing (200, 202) improves the photocurrent slightly which can be due to the effect of light on the switching operation of the TFT. Also, due to the switch biasing technique, the 1/f noise is reduced.

Figure 21:
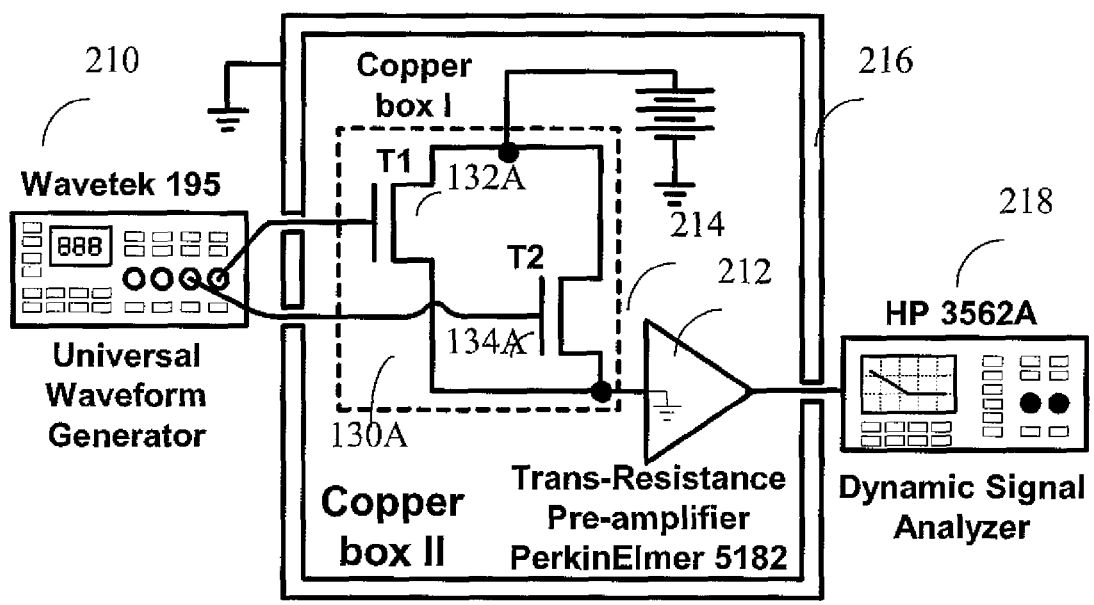
FIG. 21 is a diagram illustrating the setup for measuring the noise of the photo pixel circuit of FIG. 13.

FIG. 21 shows a setup for measuring the noise of a photo pixel circuit 130A. Photo pixel circuit 130A includes TFT 132A and 134A, which correspond to TFT 132 and TFT 134 of FIG. 13 and are TFT 160 of FIG. 16. Again, TFT 160 is an example only and the biasing could be applied to other TFTs.

The gates of TFTs 132 and 134 are operated by a universal waveform generator 210 (e.g., Wavetek 195). The second nodes of TFTs 132A and 134A are connected to a trans-resistance pre-amplifier 212 (e.g., PerkinElmer 5182). The photo pixel circuit is in a Copper box I, 214. The photo pixel circuit and the trans-resistance 212 are in a Copper box II, 216. The output from the trans-resistance 212 is monitored by a dynamic signal analyzer 218 (e.g., HP 3562A).

Figure 22:
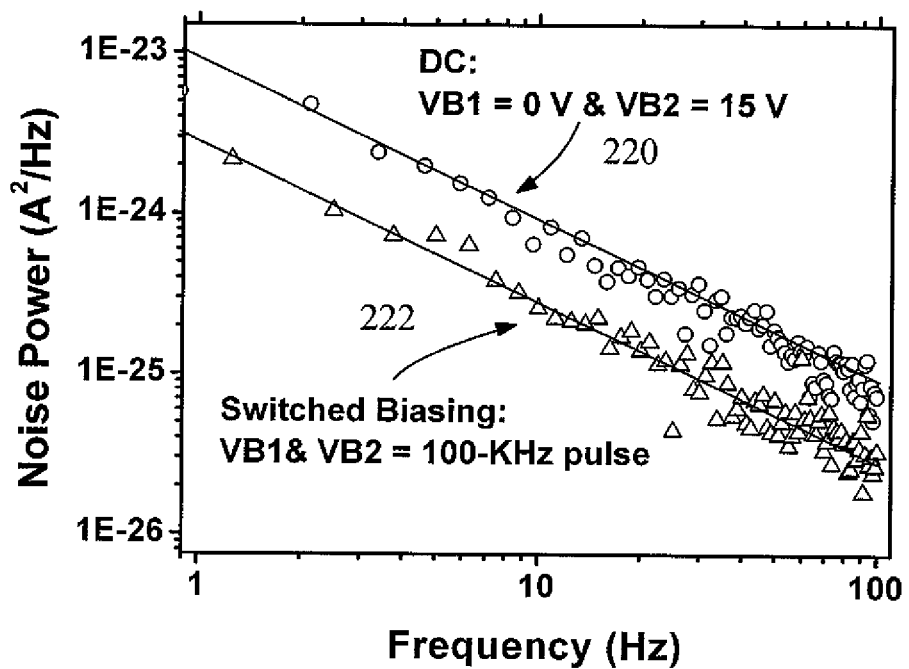
FIG. 22 is a graph showing the measuring results by the measuring environment of FIG. 20.

FIG. 22 shows the measuring results by the measuring environment of FIG. 21. The line 220 of FIG. 22 shows noise power current spectral density when VB1=0V and VB2=15V (i.e., DC, and no switch biasing), and the line 222 of FIG. 22 shows noise power spectral density when VB1 and VB2 are 100 KHz pulses and switched alternately (switch biasing). The results show that the flicker noise is dropped by over 6 dB compared to a single TFT—leading to an overall 7.5 dB improvement in SNR.

Since sensor, readout switch, and amplification are performed by the same two elements, for example, TFTs 132 and 134 or 132A and 134A, the pixel size can be made relatively small. For example, with state of the art a-Si:H technology with a 3-µm channel length, the TFT aspect ratio drops to less than 100 µm/3 µm reducing the pixel size to 50×50 µm$^2$ or smaller areas. Consequently, the photo-TFT pixel can provide high resolution imaging capability over large area.

The measurement results presented here show that the trap-assisted absorption in the a-Si:H photo-TFT can be deployed for improving the responsivity to NIR and UV leading to a low cost, large-area solution for imaging. The SNR is significantly improved by virtue of switch biasing. The pixel architecture example showy, here can be easily extended to a variety of other imaging applications, enabling new microscopy and spectroscopy techniques for a wide range of modalities associated with imaging at molecular and cellular levels to imaging at tissue and organ levels. The implementation of the pixel circuit and architecture disclosed here can be extended to crystalline Si (and CMOS) technologies, as well as thin film micro-/nano-crystalline Si and organic technologies on non-conventional substrates including glass, plastic and metal foils.

Figure 23:
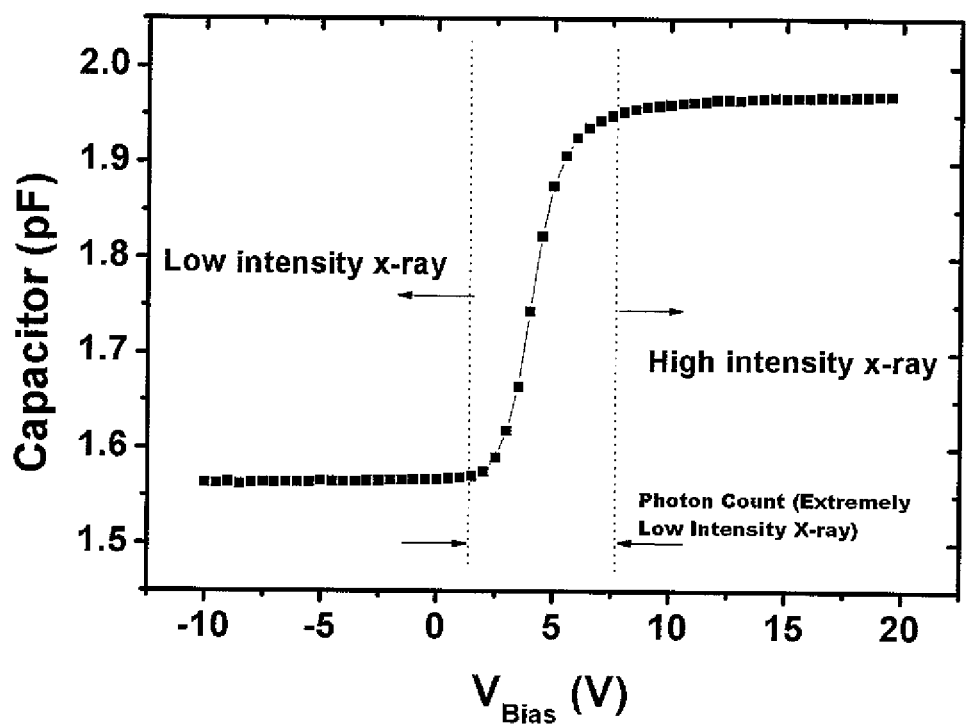
FIG. 23 is a graph showing variation of a storage capacitance for a capacitor applicable to the sensor pixel.

In the pixels described above, the storage capacitor (e.g., 16 of FIG. 1, 46 of FIG. 4, 78 of FIG. 7, 118 of FIG. 10) may be a variable capacitor to improve the pixel performance at different input intensity. For example, for x-ray imager, a low capacitor is desired for low x-ray intensity to improve the charge to voltage conversion. On the other hand, for high x-ray intensity a large capacitance gives better performance in terms of dynamic range. One way to achieving a variable capacitor is to use a metal-insulator-semiconductor (MIS) structure instead of metal-insulator-metal (MIM). By changing the bias condition of the bias line (e.g., VB1), one can adjust the storage capacitance for different application as shown in FIG. 23.

Figure 24:
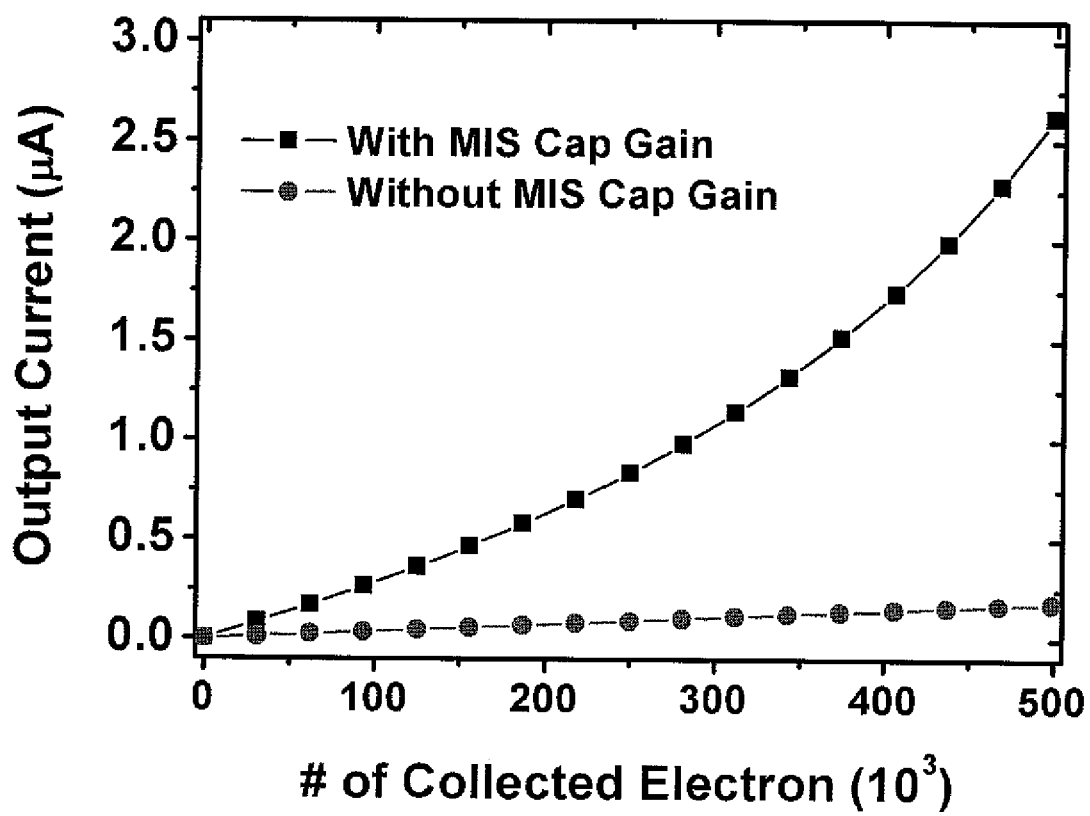
FIG. 24 is a graph showing the pixel performance using MIS-capacitor gain for extremely low intensity input signals (photon count)
Figure 25:
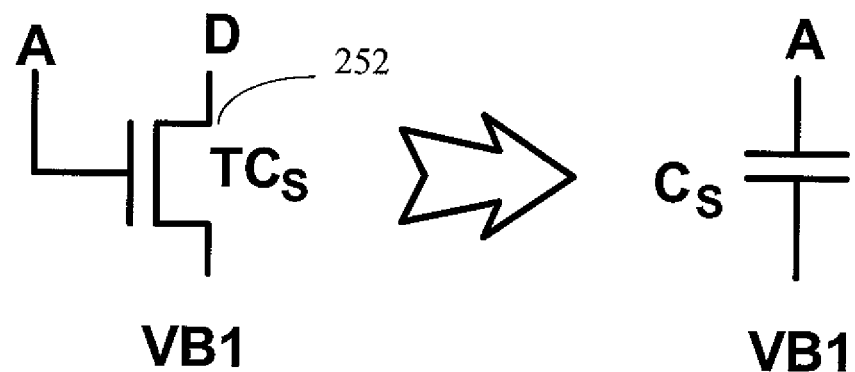
FIG. 25 is a diagram illustrating an example of using a transistor as the storage capacitor.

In the pixel described above, the variable storage capacitor can be biased at the transition edge to improve the in-pixel gain. FIG. 24 shows the pixel performance using MIS capacitive gain suitable for photon count and extremely low dose input signal.

Figure 26:
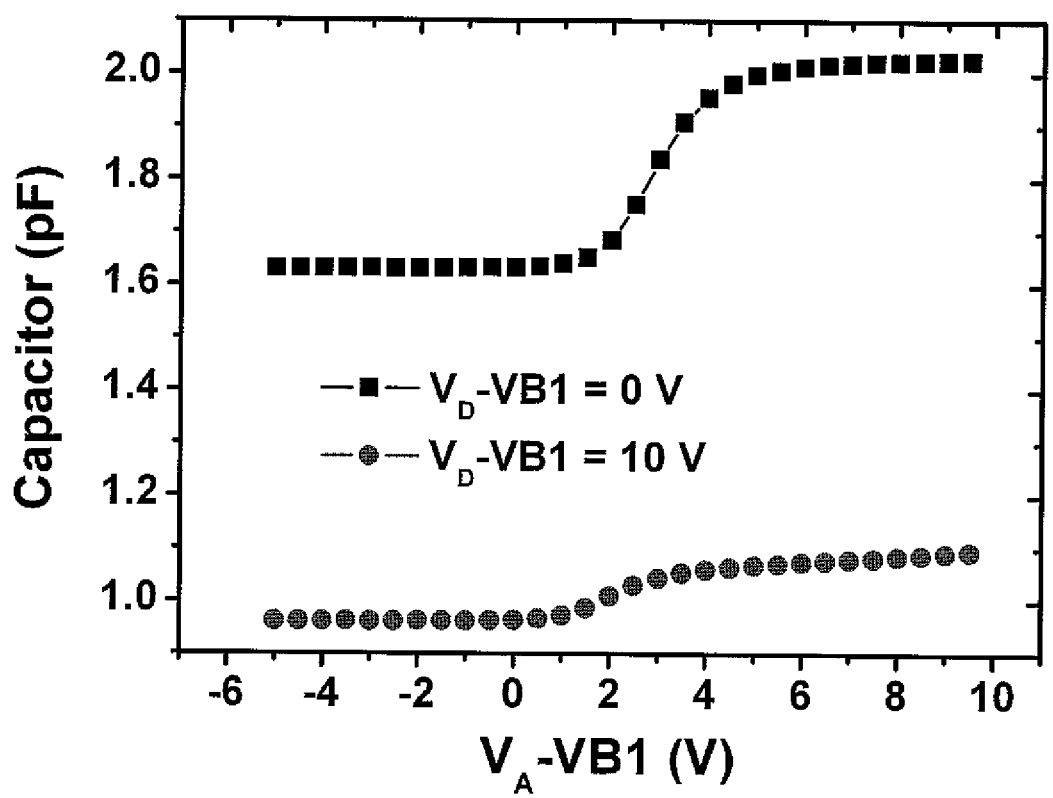
FIG. 26 is a graph showing variation of a transistor-based storage capacitance for a capacitor applicable to the pixel.

In the pixels described above, the storage capacitor (e.g., 16 of FIG. 1, 46 of FIG. 4, 78 of FIG. 7, 118 of FIG. 11) can be a transistor to improve the pixel performance at different input intensity. The transistor-based storage capacitor includes a transistor 252. The transistor 252 has first and second terminals and a gate terminal. It is well understood by one of ordinary skill in the art that the NMOS transistor 252 can be replaced with a PMOS transistor using the concept of complementary circuit design. By changing the gate-source voltage of the transistor 252 and drain-source voltage of the transistor 252, one can adjust the storage capacitor for different application as shown in FIG. 26. Here, the transistor-based variable capacitor provides more flexibility for multi-modal imagers and sensors.

Similarly, the sensor of a sensor pixel, such as 51 of FIG. 1, 4, 7 or 11 may be a capacitor for non-optical sensors, such as for example mechanical or chemical sensor applications. Such sensors may be a variable capacitor similar to the variable storage capacitor (e.g., 16 of FIG. 1, 46 of FIG. 4, 78 of FIG. 7, 118 of FIG. 11) described above. Such sensors can be implemented using the MIS structure described with respect to the storage capacitor (e.g., 16 of FIG. 1, 46 of FIG. 4, 78 of FIG. 7, 118 of FIG. 11). This will also serve to provide carge gain. If desired, the sensor variable capacitor and the storage capacitor can be the same capacitor for particular applications.

In some embodiments sensor pixels described herein can be suitable for high resolution arrays. Aging in some embodiments of sensor pixels described herein can be reduced as bias stress is limited. In some embodiments sensor pixels described herein can provide compensation for aging. In some embodiments sensor pixels described herein can support both static imaging and real time imaging. In some embodiments sensor pixels described herein can reduce cross talk caused by the other rows during read operation as the pixels are totally OFF after being readout. Also, in some embodiments the sensor pixels described herein can provide a variable capacitor to permit increased performance for particular multi-modal applications. For example for a low input intensity sensor, a small storage capacitor can be used to improve the charge-to-voltage conversion, while for large x-ray intensity a large capacitor can be used to improve dynamic range.

In some embodiments the sensor pixels described herein can be used in place of pixels in existing charge coupled devices (CCDs) commonly used in a variety of applications, including bio-imaging, to improve upon some aspects of performance, while potentially decreasing cooling requirements and providing a size decrease with resulting increase in efficiency over large.

One or more currently preferred embodiments have been described by way of example. It will be apparent to persons skilled in the art that a number of variations and modifications can be made without departing from the scope of the invention as defined in the claims.

What is claimed is:

1. A sensor pixel, comprising:
an amplifying transistor having a first terminal, a second terminal and a gate terminal, the first terminal of the amplifying transistor being coupled to a first bias line;
a switch transistor having a first terminal, a second terminal and a gate terminal, the gate terminal of the switch transistor being operated by a control line;
a storage capacitor having a first terminal and a second terminal, the first terminal of the storage capacitor being coupled to a second bias line; and
a sensor,
the second terminal of the amplifying transistor and the first terminal of the switch transistor being coupled to at least one data line, and
the sensor, the second terminal of the storage capacitor, the second terminal of the switch transistor being coupled to the gate terminal of the amplifying transistor.

2. The sensor pixel as claimed in claim 1, wherein the at least one data line comprises:

a first data line coupled to the second terminal of the amplifying transistor; and a second data line coupled to the first terminal of the switch transistor.

3. The sensor pixel as claimed in claim 1, wherein each of the first and second bias lines and the data line is used at a predetermined timing to bias the pixel.

4. The sensor pixel as claimed in claim 1, wherein the storage capacitor is a variable capacitor.

5. The sensor pixel as claimed in claim 1, wherein the sensor is a variable capacitor.

* * * * *